(12) United States Patent
Lee et al.

(10) Patent No.: US 9,502,291 B2
(45) Date of Patent: Nov. 22, 2016

(54) SEMICONDUCTOR MAGNETIC MEMORY DEVICE AND METHOD FOR MANUFACTURING THE SAME

(71) Applicants: Kilho Lee, Hwaseong-si (KR); Shinhee Han, Seongnam-si (KR)

(72) Inventors: Kilho Lee, Hwaseong-si (KR); Shinhee Han, Seongnam-si (KR)

(73) Assignee: SAMSUNG ELECTRONICS CO., LTD. (KR)

(*) Notice: Subject to any disclaimer, the term of this patent is extended or adjusted under 35 U.S.C. 154(b) by 0 days.

(21) Appl. No.: 14/738,814

(22) Filed: Jun. 12, 2015

(65) Prior Publication Data

US 2016/0005739 A1 Jan. 7, 2016

(30) Foreign Application Priority Data

Jul. 7, 2014 (KR) .................. 10-2014-0084651

(51) Int. Cl.

| | | |
|---|---|---|
| *H01L 21/768* | (2006.01) | |
| *H01L 29/423* | (2006.01) | |
| *H01L 21/311* | (2006.01) | |
| *H01L 29/66* | (2006.01) | |
| *H01L 43/08* | (2006.01) | |
| *H01L 43/10* | (2006.01) | |
| *H01L 43/12* | (2006.01) | |

(52) U.S. Cl.
CPC .... *H01L 21/76877* (2013.01); *H01L 21/31111* (2013.01); *H01L 21/31144* (2013.01); *H01L 21/76808* (2013.01); *H01L 21/76816* (2013.01); *H01L 21/76895* (2013.01); *H01L 21/76897* (2013.01); *H01L 29/4236* (2013.01); *H01L 29/66621* (2013.01); *H01L 43/08* (2013.01); *H01L 43/10* (2013.01); *H01L 43/12* (2013.01)

(58) Field of Classification Search
CPC ................................. H01L 29/41766
USPC .................... 438/618, 1, 3; 257/295, 421
See application file for complete search history.

(56) References Cited

U.S. PATENT DOCUMENTS

| | | | |
|---|---|---|---|
| 6,784,091 B1 * | 8/2004 | Nuetzel ............ | B82Y 10/00 257/E21.577 |
| 7,183,130 B2 | 2/2007 | Nuetzel et al. | |
| 7,541,199 B2 | 6/2009 | Bae et al. | |
| 8,110,881 B2 | 2/2012 | Kao et al. | |
| 8,564,079 B2 | 10/2013 | Kang et al. | |
| 2005/0023581 A1 | 2/2005 | Nuetzel et al. | |
| 2006/0054950 A1 * | 3/2006 | Baek ............... | H01L 27/112 257/295 |

(Continued)

FOREIGN PATENT DOCUMENTS

JP 2013065756 A 4/2013

*Primary Examiner* — Marc Armand
*Assistant Examiner* — Shannon Yi
(74) *Attorney, Agent, or Firm* — Renissance IP Law Group LLP

(57) ABSTRACT

A semiconductor memory device includes a first insulating layer covering a substrate, a first contact plug and a second contact plug each penetrating the first insulating layer, a first data storage element disposed on the first contact plug, and a second data storage element disposed on the second contact plug. The first contact plug includes a vertically extending portion and a horizontally extending portion arranged between the vertically extending portion and the first data storage element, and the second contact plug extends substantially vertically from a top surface of the substrate. The first data storage element is laterally spaced apart from the vertically extending portion when viewed in plan view. The first data storage element is disposed on the horizontally extending portion.

18 Claims, 22 Drawing Sheets

(56) References Cited

U.S. PATENT DOCUMENTS

| | | |
|---|---|---|
| 2006/0246604 A1 | 11/2006 | Bae et al. |
| 2009/0085132 A1 | 4/2009 | Kao et al. |
| 2009/0261434 A1 | 10/2009 | Kang et al. |
| 2010/0003767 A1* | 1/2010 | Cho .................. H01L 43/08 438/3 |
| 2011/0233696 A1 | 9/2011 | Li |
| 2013/0043530 A1* | 2/2013 | Kim .................. H01L 27/105 257/334 |

* cited by examiner

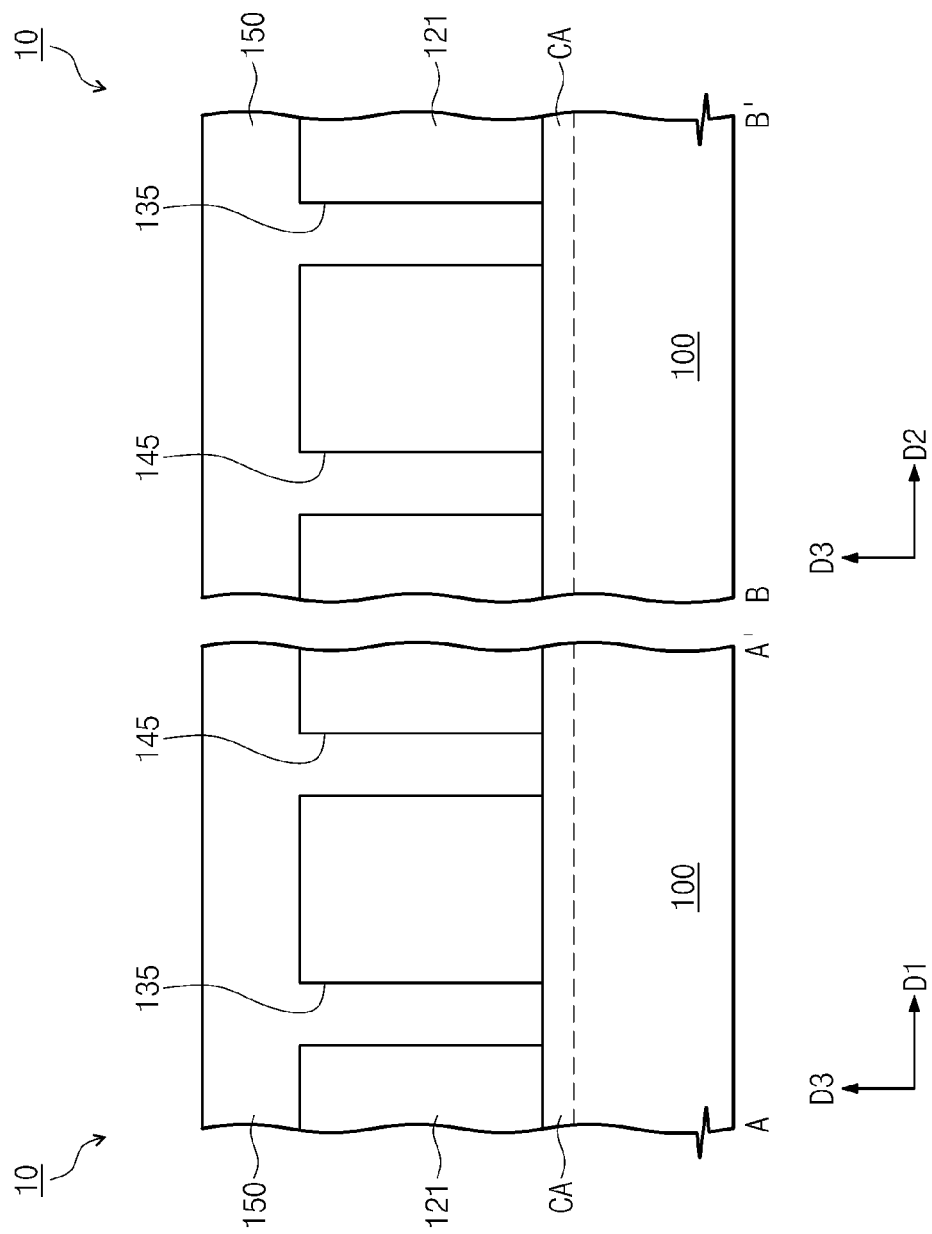

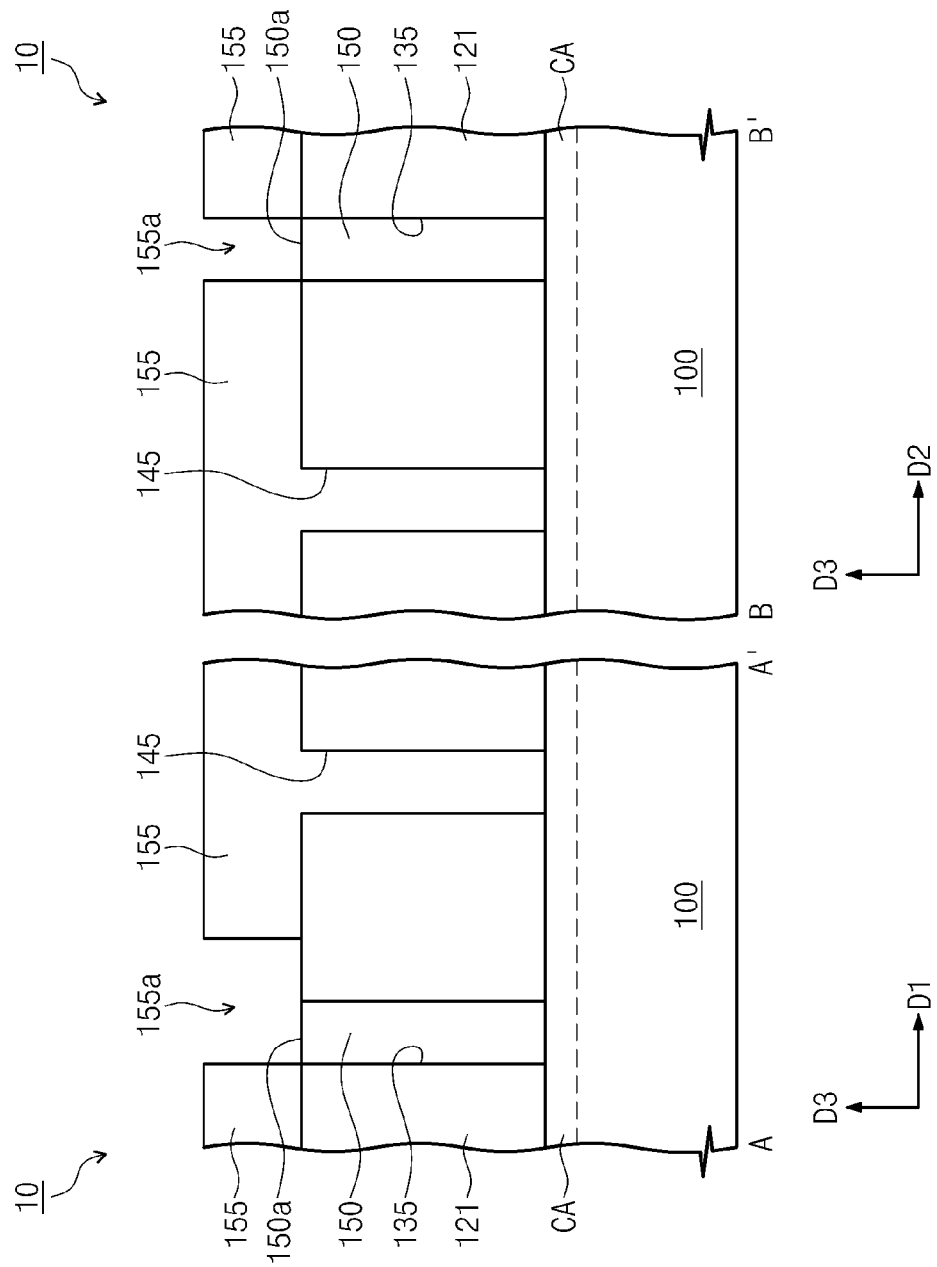

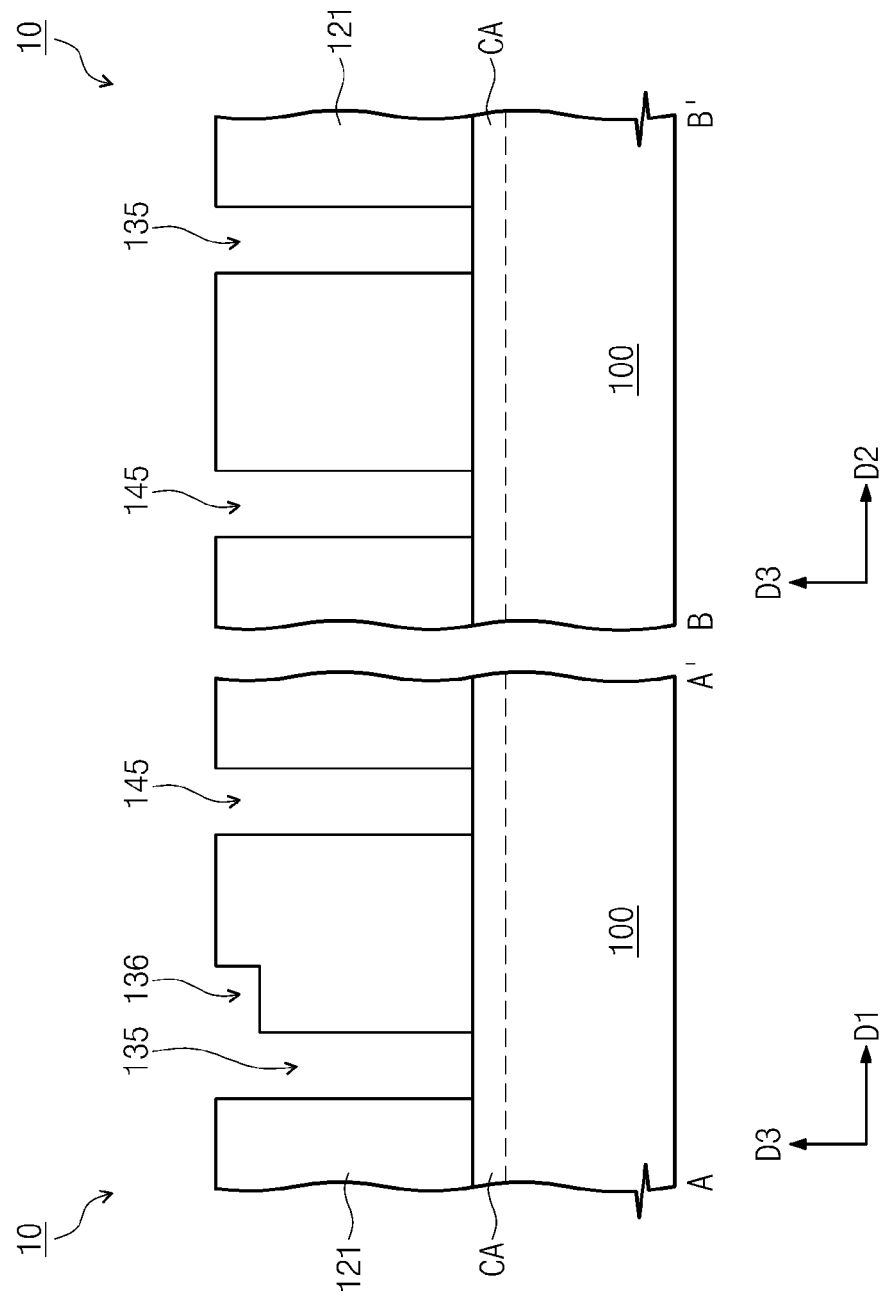

SEMICONDUCTOR MAGNETIC MEMORY DEVICE AND METHOD FOR MANUFACTURING THE SAME

CROSS-REFERENCE TO RELATED APPLICATION

This U.S. non-provisional patent application claims priority under 35 U.S.C. §119 to Korean Patent Application No. 10-2014-0084651, filed on Jul. 7, 2014, in the Korean Intellectual Property Office, the disclosure of which is hereby incorporated by reference in its entirety.

BACKGROUND

The inventive concepts relate to a semiconductor device and, more particularly, to semiconductor devices and methods for manufacturing the same.

Semiconductor devices are widely used in the electronic industry because of their small size, multi-functionality, and low manufacturing costs. Semiconductor memory devices for storing logical data have become more highly integrated with the development of the electronic industry. Widths and spaces of elements forming a semiconductor memory device have therefore been reduced.

Unfortunately, however, the reliability of semiconductor memory devices may be deteriorated as they become more highly integrated. Thus, research is being conducted to improve the reliability of semiconductor memory devices having higher integration density.

SUMMARY

Embodiments of the inventive concepts may provide semiconductor memory devices having an increased degree of freedom with respect to the arrangement of data storage elements, that are better able to prevent an electrical short, and that provide improved reliability.

Embodiments of the inventive concepts may also provide methods for manufacturing a semiconductor memory device capable of simplifying manufacturing processes.

A semiconductor memory device according to one embodiment of the inventive concepts may include: a first insulating layer covering a substrate; a first contact plug and a second contact plug penetrating the first insulating layer; a first data storage element disposed on the first contact plug and electrically connected to a portion of the substrate through the first contact plug; and a second data storage element disposed on the second contact plug and electrically connected to a portion of the substrate through the second contact plug. The first contact plug may include: a vertically extending portion; and a horizontally extending portion between the vertically extending portion and the first data storage element. The second contact plug may vertically extend from a top surface of the substrate. The first data storage element may be laterally spaced apart from the vertically extending portion when viewed in plan view. The first data storage element may be disposed on the horizontally extending portion.

In some embodiments, the first insulating layer may include a recessed region that is disposed in an upper portion of the first insulating layer. A bottom surface of the recessed region may be lower than a top surface of the first insulating layer, and the horizontally extending portion may be provided in the recessed region.

In some embodiments, a top surface of the second contact plug may be higher than a top surface of the vertically extending portion.

In some embodiments, the horizontally extending portion may be disposed on the top surface of the vertically extending portion.

In some embodiments, the horizontally extending portion may extend from the top surface of the vertically extending portion in a first direction or in a second direction that intersects the first direction in plan view.

In some embodiments, the horizontally extending portion may include: a first portion extending from the top surface of the vertically extending portion in a first direction in plan view; and a second portion extending from the first portion in a second direction that intersects the first direction in plan view.

In some embodiments, first and second contact plugs may be alternately and repeatedly arranged to form a row. Within a row, each of the odd-numbered contact plugs may be a first contact plug, and each of the even-numbered contact plugs of the row may be a second contact plug.

In some embodiments, the semiconductor memory device may further include: a cell active portion defined in the substrate; a gate recess region intersecting the cell active portion; a cell gate dielectric layer and a cell gate electrode sequentially disposed in the gate recess region; a first doped region and a second doped region respectively disposed in the cell active portion at opposite sides of the gate recess region; a second insulating layer disposed on the first insulating layer; and a source line disposed in the first insulating layer and connected to the first doped region.

In some embodiments, the first contact plug and the second contact plug may be arranged in a first direction in plan view. In this case, the source line may be disposed between the first contact plug and the second contact plug and may extend in a second direction that intersects the first direction. The horizontally extending portion may extend in the first direction or it may extend in a direction opposite to the first direction.

In some embodiments, each of the first and second contact plugs may penetrate the second and first insulating layers so as to be connected to the second doped region.

In some embodiments, the second insulating layer may include a recessed region that is disposed in an upper portion of the second insulating layer. A bottom surface of the recessed region of the second insulating layer may be lower than a top surface of the second insulating layer and higher than a top surface of the source line, and the horizontally extending portion may be provided in the recessed region of the second insulating layer.

In some embodiments, a plurality of first contact plugs and a plurality of second contact plugs may be provided. The plurality of first contact plugs and the plurality of second contact plugs may be two-dimensionally arranged in a first row and a second row that are each parallel to a first direction. The second row may be spaced apart from the first row in a second direction that intersects the first direction. Odd-numbered contact plugs of the first row and even-numbered contact plugs of the second row may be first contact plugs, and even-numbered contact plugs of the first row and odd-numbered contact plugs of the second row may be second contact plugs.

In some embodiments, the horizontally extending portions of the first row may extend in the first direction, and the horizontally extending portions of the second row may extend in a direction opposite to the first direction.

In some embodiments, each of the first and second data storage elements may include a reference magnetic pattern, a free magnetic pattern, and a tunnel barrier pattern disposed between the reference and free magnetic patterns.

In another aspect, a method for manufacturing a semiconductor memory device may include: forming at least one insulating layer on a substrate in which a cell active portion is defined; patterning the at least one insulating layer to form a first contact hole and a second contact hole that expose the substrate; forming a mask pattern on the at least one insulating layer, the mask pattern covering the second contact hole and having an opening overlapping the first contact hole and exposing a portion of the at least one insulating layer; etching the portion of the at least one insulating layer exposed by the opening to form a horizontally extending hole extending from the first contact hole; forming a first contact plug in the first contact hole and the horizontally extending hole; forming a second contact plug in the second contact hole; and forming a first data storage element and a second data storage element on the first contact plug and the second contact plug, respectively. The first contact plug and the second contact plug may be formed at the same time.

In some embodiments, forming the mask pattern may include: forming a mask layer that covers a top surface of the at least one insulating layer and fills the first and second contact holes; and patterning the mask layer to expose a portion of the insulating layer adjacent to the first contact hole.

In some embodiments, forming the horizontally extending hole may include: recessing a top surface of the mask layer filling the first contact hole and the portion of the at least one insulating layer which are exposed by the opening.

In some embodiments, the first and second contact holes may be alternately and repeatedly arranged in a row, wherein each of the odd-numbered contact holes in the row may be a first contact hole, and wherein each of the even-number contact holes in the row may be a second contact hole.

In some embodiments, forming the at least one insulating layer may include: forming a first insulating layer on the substrate; forming a source line in the first insulating layer; and forming a second insulating layer on the first insulating layer and covering the source line. The opening of the mask pattern may overlap the first contact hole and may expose a portion of the second insulating layer.

In some embodiments, a plurality of first and a plurality of second contact holes may be provided. The plurality of first contact holes and the plurality of second contact holes may be two-dimensionally arranged in a first row and a second row that are each parallel to a first direction. The second row may be spaced apart from the first row in a second direction that intersects the first direction. Odd-numbered contact holes of the first row and even-numbered contact holes of the second row may be first contact holes, and even-numbered contact holes of the first row and odd-numbered contact holes of the second row may be second contact holes.

In some embodiments, the method may further include: forming a gate recess region intersecting the cell active portion in the substrate; forming a cell gate dielectric layer and a cell gate electrode in the gate recess region; forming a first doped region and a second doped region in the cell active portion at opposite sides of the gate recess region, respectively; and forming a bit line connected to the first data storage element and the second data storage element. The source line may be connected to the first doped region, and one of the first contact hole and the second contact hole may expose the second doped region.

BRIEF DESCRIPTION OF THE DRAWINGS

The inventive concepts will become more readily apparent in view of the attached drawings and accompanying detailed description.

FIGS. 2A through 2E provide cross-sectional views of a semiconductor memory device at different stages of manufacture, again taken along lines A-A' and B-B' of FIG. 1A, illustrating a method for manufacturing a semiconductor memory device according to an example embodiment of the inventive concepts;

DETAILED DESCRIPTION

Figure 1A:
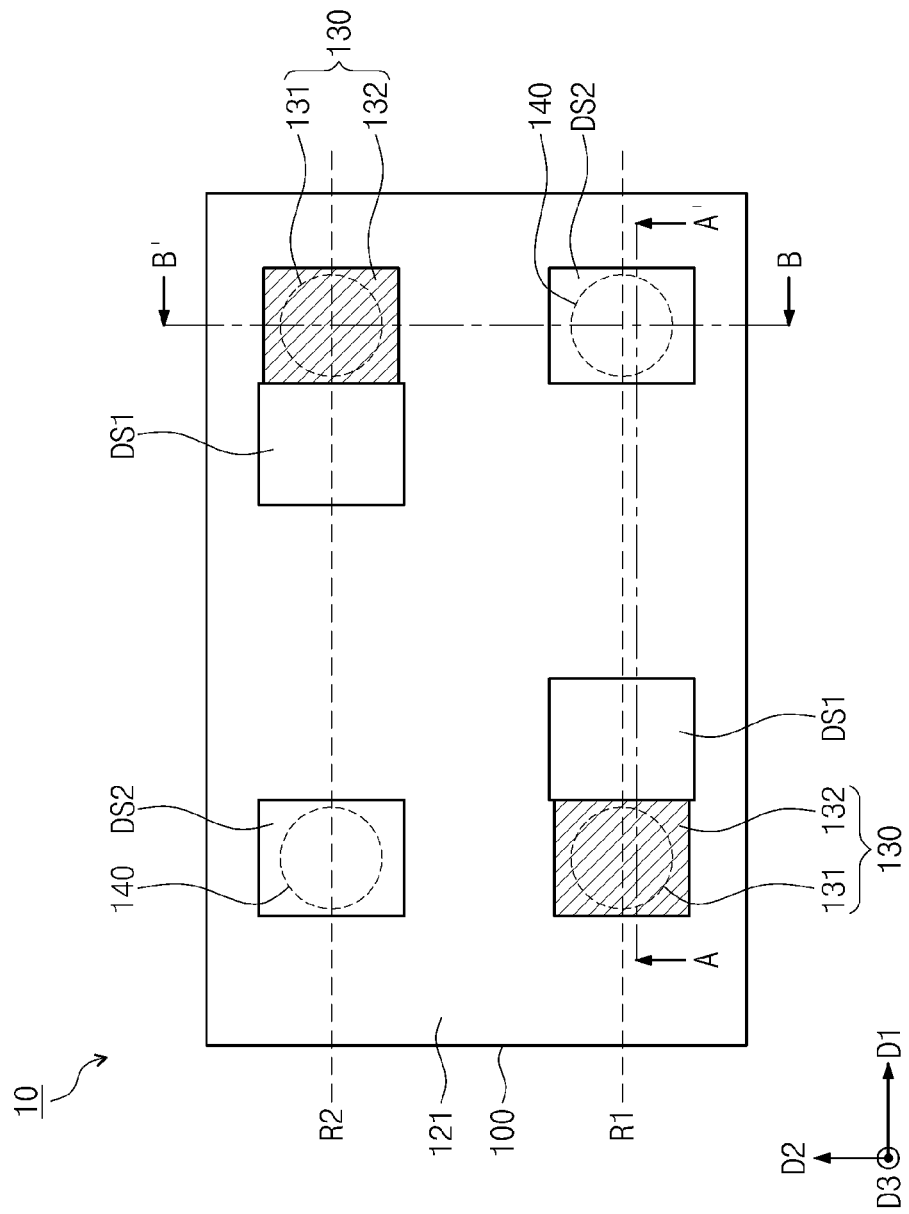
FIG. 1A is a plan view of a semiconductor memory device according to an example embodiment of the inventive concepts.

The inventive concepts will now be described more fully hereinafter with reference to the accompanying drawings, in which exemplary embodiments of the inventive concepts are shown. The advantages and features of the inventive concepts and methods of achieving them will also become more readily apparent from the following description. It should be noted, however, that the inventive concepts are not limited to the following exemplary embodiments, and may be implemented in various forms. Accordingly, the below exemplary embodiments are provided simply to disclose the inventive concepts to those skilled in the art and enable them to practice the inventive concepts. Furthermore, the embodiments should not themselves be construed as being limited to the specific examples provided herein, and features and components thereof may be exaggerated for clarity.

The terminology used herein is provided to describe particular embodiments only, and is not intended to limit the inventive concepts. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element, or intervening elements may be present.

Similarly, it will be understood that when an element, such as a layer, region or substrate, is referred to as being "on" another element, it can be directly on the other element or intervening elements may be present. In contrast, the term "directly" means that there are no intervening elements. It will be further understood that the terms "comprises", "comprising", "includes" and/or "including", when used herein, specify the presence of the stated features, integers, steps, operations, elements, and/or components, but do not preclude the presence or addition of one or more other features, integers, steps, operations, elements, components, and/or groups thereof.

Additionally, the embodiments in the following detailed description will be described with sectional views that are idealized exemplary views. Accordingly, the shapes and sizes are areas, components, features, or regions shown in the exemplary views may vary in practice according to manufacturing techniques and/or to accommodate allowable errors. Therefore, the inventive concepts are not limited to the specific shapes or sizes of features illustrated in the exemplary views, but may include other shapes and sizes that may vary according to manufacturing processes. Areas exemplified in the drawings have general properties, and are not used to illustrate the specific shapes of the represented elements. Thus, the drawings should not be construed as limiting the scope of the inventive concepts.

It will be also understood that although the terms "first", "second", "third", etc. may be used herein to describe various elements, the inventive concepts should not be limited by these terms. These terms are only used to distinguish one element from another element. Thus, a "first" element in some embodiments could be termed a "second" element in other embodiments without departing from the teachings of the present inventive concepts. Exemplary embodiments of aspects of the present inventive concepts explained and illustrated herein include their complementary counterparts. The same reference numerals or designators denote the same elements throughout the specification.

Again, the exemplary embodiments are described herein with reference to cross-sectional and/or planar views that are idealized. Accordingly, variations from the shapes and sizes indicated in the illustrations as a result, for example, of manufacturing techniques and/or tolerances, are to be expected. Thus, the inventive concepts should not be construed as being limited to the shapes or sizes of regions illustrated herein, but include deviations in shapes and sizes that result, for example, from manufacturing techniques or processes. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of the inventive principles.

As appreciated by the present inventive entity, devices and methods of forming devices according to various embodiments described herein may be embodied in microelectronic devices such as integrated circuits, wherein a plurality of devices are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide a three-dimensional integrated circuit.

Accordingly, the cross-sectional view(s) illustrated herein provide support for a plurality of devices that may extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

First Embodiment

Figure 1B:
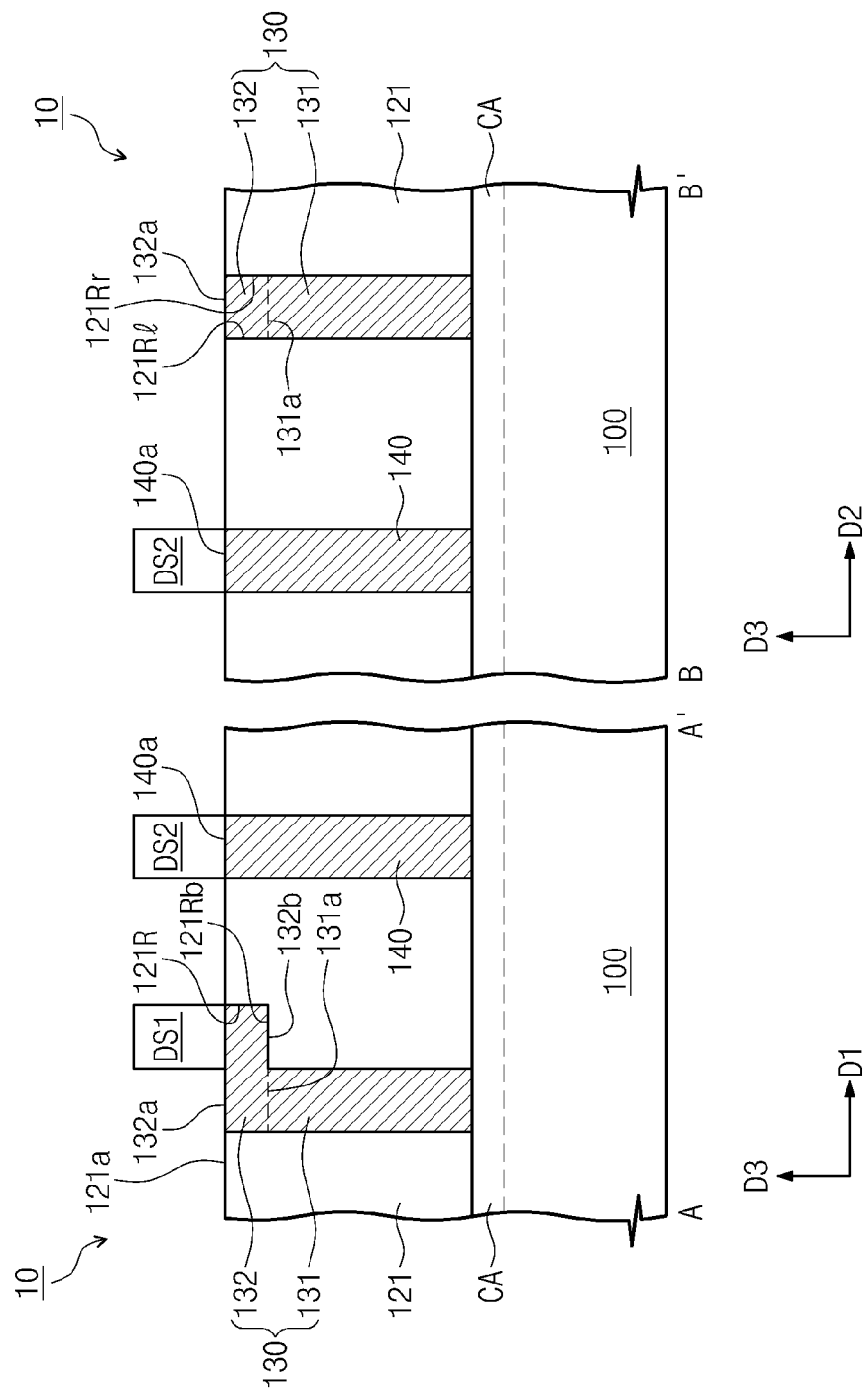
FIG. 1B provides cross-sectional views of the semiconductor memory device of FIG. 1A, taken along lines A-A' and B-B'.

FIG. 1A is a plan view of a semiconductor memory device 10 according to an example embodiment of the inventive concepts, and FIG. 1B provides cross-sectional views of the semiconductor memory device 10 of FIG. 1A, taken along lines A-A' and B-B'.

Referring to FIGS. 1A and 1B, a substrate 100 may include a cell active portion CA that is formed in an upper portion of the substrate 100. Although not illustrated in the drawings, the cell active portion CA may include doped regions and gate electrodes. The substrate 100 and the cell active portion CA will be described later in greater detail.

At least one insulating layer may be disposed on the substrate 100. The insulating layer may include a first insulating layer 121. The first insulating layer 121 may substantially cover the substrate 100.

First contact plugs 130 and second contact plugs 140 may penetrate the first insulating layer 121 so as to be electrically connected to the cell active portion CA. Top surfaces of the first contact plugs 130 and top surfaces of the second contact plugs 140 may be substantially coplanar with a top surface of the first insulating layer 121. A first data storage element DS1 may be disposed on each respective one of the first contact plugs 130, and a second data storage element DS2 may be disposed on each respective one of the second contact plugs 140. The first data storage element DS1 may be electrically connected to the cell active portion CA through the first contact plug 130, and the second data storage element DS2 may be electrically connected to the cell active portion CA through the second contact plug 140. The first and second data storage elements DS1 and DS2, respectively, will be described later in greater detail.

Each of the first contact plugs 130 may include a vertically extending portion 131 and a horizontally extending portion 132. The vertically extending portion 131 may extend vertically from a top surface of the cell active portion CA, and the horizontally extending portion 132 may be disposed between the vertically extending portion 131 and the first data storage element DS1.

The vertically extending portion 131 may extend in a third direction D3 that is perpendicular to first and second directions D1 and D2, respectively, that are each parallel to the top surface of the substrate 100. The horizontally extending portion 132 may be disposed on the vertically extending portion 131 to extend in the first direction D1 that is parallel to the top surface of the substrate 100. Alternatively, the horizontally extending portion 132 may extend in a direction opposite to the first direction D1. However, the inventive concepts are not limited thereto. When viewed from a plan view, a width of the horizontally extending portion 132 may be equal to or greater than a width of the vertically extending portion 131. However, the inventive concepts are not limited thereto.

The first insulating layer 121 may include a recessed region 121R that is formed in an upper portion of the first insulating layer 121. A bottom surface 121Rb of the recessed region 121R may be lower than the top surface 121a of the first insulating layer 121 and may be substantially coplanar with a top surface 131a of the vertically extending portion 131. The horizontally extending portion 132 may be provided in the recessed region 121R. In other words, the horizontally extending portion 132 may completely, or substantially completely, fill the recessed region 121R. More specifically, the horizontally extending portion 132 may be defined as a conductive layer that is surrounded by sidewalls 121R1 and 121Rr and the bottom surface 121Rb of the recessed region 121R and the top surface 131a of the vertically extending portion 131. A top surface 132a of the horizontally extending portion 132 may be substantially coplanar with the top surface 121a of the first insulating layer 121. A bottom surface 132b of the horizontally extending portion 132 may be substantially coplanar with the bottom surface 121Rb of the recessed region 121R. In other words, the bottom surface 132b of the horizontally extending portion 132 may be in contact with the bottom surface 121Rb of the recessed region 121R.

The first data storage element DS1 may be disposed on the top surface 132a of the horizontally extending portion 132. Here, the first data storage element DS1 may be horizontally spaced apart from the vertically extending portion 131. In other words, the first data storage element DS1 may be offset from the vertically extending portion 131. More specifically, as illustrated in FIG. 1A, the first data storage element DS1 may be spaced apart from the vertically extending portion 131 in the first direction D1 when viewed in plan view. Alternatively, the first data storage element DS1 may be spaced apart from the vertically extending portion 131 in a direction opposite the first direction D1. However, the inventive concepts are not limited thereto. When viewed in plan view, the first data storage element DS1 may, for instance, not overlap at all with the vertically extending portion 131, or may only partially overlap the vertically extending portion 131. The vertically extending portion 131 and the horizontally extending portion 132 may be formed at the same time to constitute a single, integrated structure.

Each of the second contact plugs 140 may vertically extend from a top surface of the cell active portion CA. In other words, unlike the first contact plug 130, the second contact plug 140 may extend in only the third direction D3 and may not include a horizontally extending portion 132. Thus, a top surface 140a of the second contact plug 140 may be higher than the top surface 131a of the vertically extending portion 131. The top surface 140a of the second contact plug 140 may be located at substantially the same level as the top surface 132a of the horizontally extending portion 132. The second data storage element DS2 may be disposed on the top surface 140a of the second contact plug 140. As illustrated in FIG. 1A, the second data storage element DS2 may substantially entirely overlap the second contact plug 140.

As illustrated in FIG. 1A, the first contact plugs 130 and the second contact plugs 140 may be two-dimensionally arranged in a first row R1 and a second row R2 that are each parallel to the first direction D1. The second row R2 may be spaced apart from the first row R1 in the second direction D2. The first and second contact plugs 130 and 140, respectively, of each of the first and second rows R1 and R2, respectively, may be alternately arranged in the first direction D1.

More particularly, a first of the contact plugs in the first row R1 may be a first contact plug 130, and a second of the contact plugs in the first row R1 may be a second contact plug 140. The first and second contact plugs 130 and 140, respectively, may be alternately and repeatedly arranged in the first row R1. Thus, a third (not shown) of the contact plugs in the first row R1 may again be a first contact plug 130, and a fourth (not shown) of the contact plugs in the first row R1 may again be a second contact plug 140. In other words, odd-numbered contact plugs in the first row R1 may be first contact plugs 130, and even-numbered contact plugs in the first row R1 may be second contact plugs 140.

In a similar manner, a first of the contact plugs of the second row R2 may be a second contact plug 140, and a second of the contact plugs in the second row R2 may be a first contact plug 130. The second and first contact plugs 140 and 130, respectively, in the second row R2 may be alternately and repeatedly arranged. Thus, a third (not shown) of the contact plugs in the second row R2 may be a second contact plug 140, and a fourth (not shown) of the contact plugs in the second row R2 may be a first contact plug 130. In other words, odd-numbered contact plugs in the second row R2 may be second contact plugs 140, and even-numbered contact plugs in the second row R2 may be first contact plugs 130.

In this configuration, the first contact plug 130 of the first row R1 may therefore include a horizontally extending portion 132 extending in the first direction D1. The first contact plug 130 of the second row R2 may include a horizontally extending portion 132 extending in a direction opposite the first direction D1. Alternatively, each of the first contact plugs 130 of the first and second rows R1 and R2, respectively, may include a horizontally extending portion 132 extending in the first direction D1 or in a direction opposite the first direction D1. In other words, the extending directions of the horizontally extending portions 132 of the first contact plugs 130 of the first and second rows R1 and R2, respectively, may be selected depending on a desired arrangement of the first data storage elements DS1.

In the semiconductor memory device 10 according to the embodiment described above, unlike the first contact plug 130, the second contact plug 140 may not include a horizontally extending portion. By providing a horizontally extending portion on only one of two adjacent contact plugs, rather than both, it is possible to increase a horizontal distance between the first data storage element DS1 and the second contact plug 140 adjacent thereto as compared to a conventional device. In addition, it is possible to increase a horizontal distance between the horizontally extending portion 132 of the first contact plug 130 and the second contact plug 140 adjacent thereto as compared to the conventional device.

In a conventional device, pads are typically disposed between each MTJ element and its corresponding contact electrically connected to the substrate. This may result in problems as compared to the present inventive concepts, because a distance between a first MTJ element and a pad arranged under a second MTJ element may be reduced as compared to a related distance in an embodiment according to the present inventive concepts. Embodiments according to the present inventive concepts, however, may omit the pads entirely, with the first contact plug under the first MTJ element DS1 instead including a horizontally extending portion 132 and the second contact plug 140 under a second memory element DS2 including only a vertically extending portion. Accordingly, a distance between the first MTJ element DS1 and the second contact plug 140 and a distance between the horizontally extending portion 132 and the second contact plug 140 may be greater than corresponding distances in the conventional device.

As a result, a process margin during a method of manufacturing such a semiconductor memory device may be improved. In addition, since the second data storage element DS2 substantially overlaps the second contact plug 140, it is also possible to reduce the risk of an electrical short, or prevent an electrical short from occurring at an upper portion of the second contact plug 140 during a process for patterning the second data storage element DS2.

More specifically, in a conventional device, if an etching process is performed on the MTJ layer to form MTJ elements, metal materials may be extracted from the exposed portions of the pads. These extracted metal materials may then latch onto the MTJ elements thereby causing an electrical short between upper portions of adjacent pads. According to principles of the present invention, however, this problem may be avoided. Although the first contact plugs 130 may still include exposed top portions, the second contact plugs 140 may not include exposed top portions during an etching process. Therefore, metal materials may not be extracted from the second contact plugs 140 during the etching process and the risk of a short may be substantially reduced.

FIGS. 2A through 2E are cross-sectional views illustrating a method for manufacturing a semiconductor memory device according to an example embodiment of the inventive concepts.

Figure 2A:
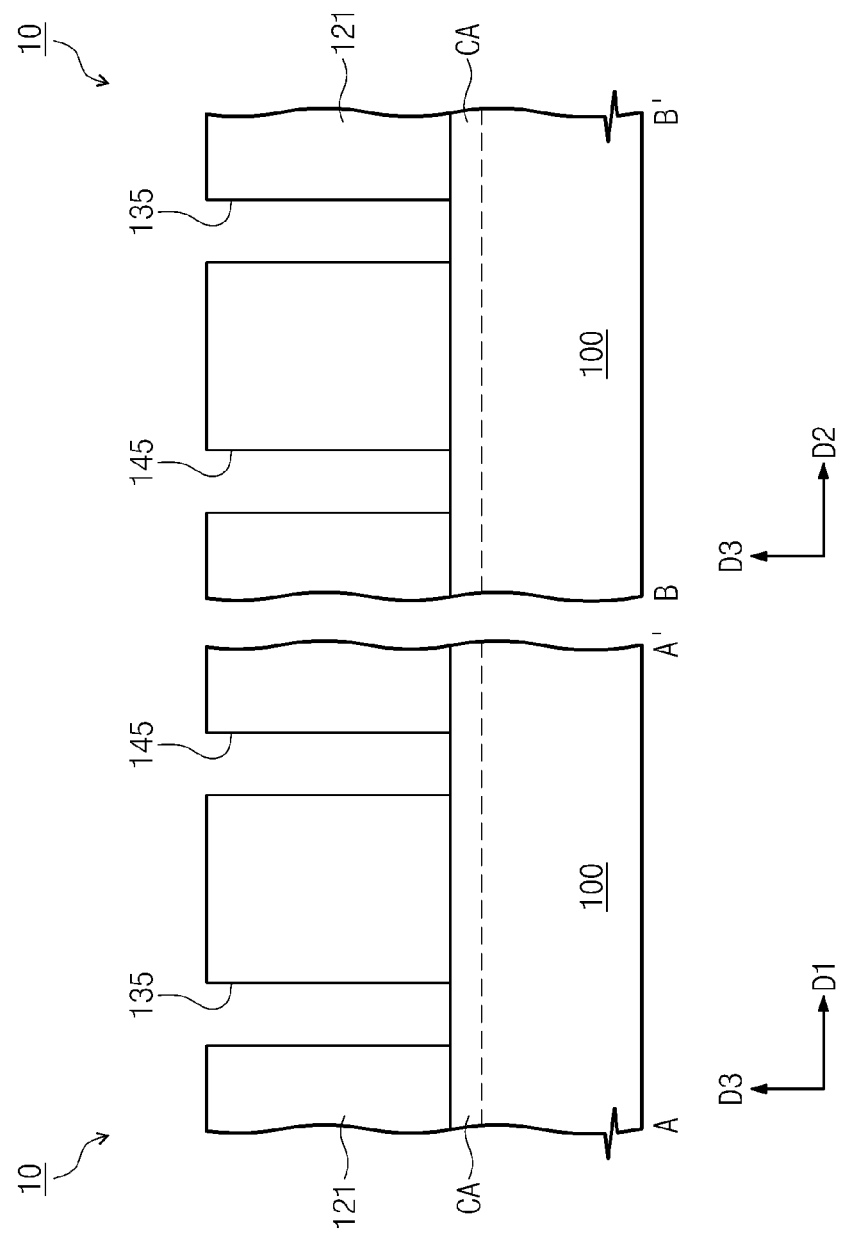

Referring to FIG. 2A, a substrate 100 may be prepared having a cell active portion CA defined therein. The substrate 100 may, for example, be a silicon substrate, a germanium substrate, or a silicon-germanium substrate. The substrate 100 may be the same as was described previously with reference to FIGS. 1A and 1B. Next, at least one insulating layer may be formed on the substrate 100. The insulating layer may include an oxide (e.g., silicon oxide). The insulating layer may include a first insulating layer 121. The first insulating layer 121 may be patterned to form first contact holes 135 and second contact holes 145 that expose the substrate 100. Each of the first and second contact holes 135 and 145, respectively, may extend vertically from a top surface of the cell active portion CA to a top surface of the first insulating layer 121. The first and second contact holes 135 and 145, respectively, may be alternately arranged in a first row R1 arranged in a first direction D1 (see FIG. 1A). Odd-numbered contact holes in the first row R1 may be first contact holes 135, and even-numbered contact holes in the first row R1 may be second contact holes 145.

Referring to FIG. 2B, a mask layer 150 may be formed on the first insulating layer 121. The mask layer 150 may cover a top surface of the first insulating layer 121 and may fill the first and second contact holes 135 and 145, respectively. The mask layer 150 may be formed of a material having an etch selectivity with respect to the first insulating layer 121. For example, the mask layer 150 may include at least one of a nitride (e.g., silicon nitride) and an oxynitride (e.g., silicon oxynitride).

Referring to FIG. 2C, the mask layer 150 may be patterned to form a mask pattern 155 having openings 155a. Each of the openings 155a may at least partially overlap with a corresponding one of the first contact holes 135 and may expose a portion of the first insulating layer 121. More specifically, the opening 155a may expose a top surface 150a of the mask layer 150 filling the first contact hole 135 and a portion of a top surface of the first insulating layer 121. The openings 155a may not, however, overlap the second contact holes 145. In other words, the mask layer 150 filling and covering the second contact hole 145 may not be removed, so that the mask pattern 155 covers and fills the second contact hole 145.

Figure 2D:
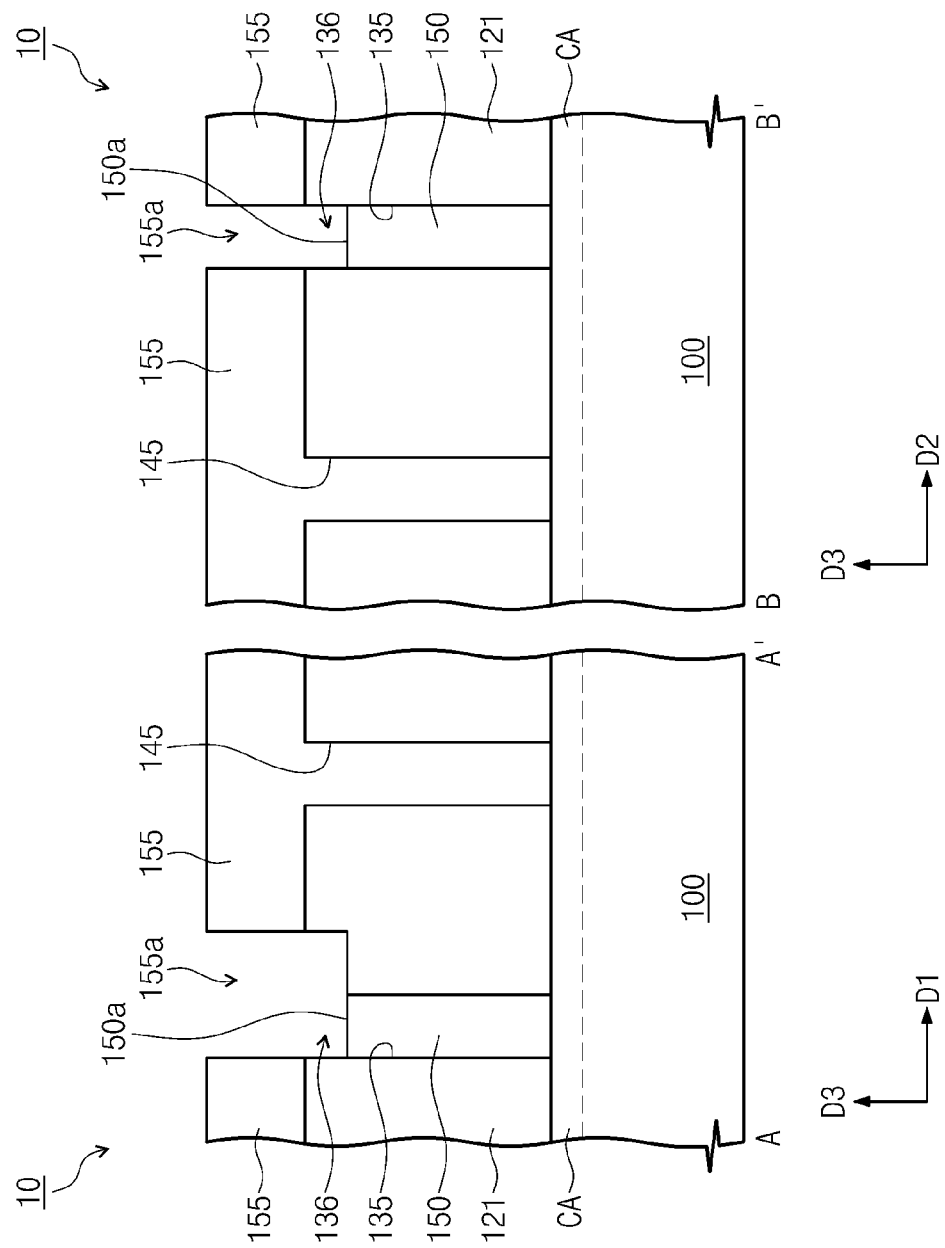

Referring to FIG. 2D, regions exposed by the openings 155a may be patterned to form horizontally extending holes 136 that extend from the first contact holes 135, respectively. More specifically, the portions of the first insulating layer 121, which are exposed by the openings 155a, may be etched to form the horizontally extending holes 136. Forming the horizontally extending holes 136 may include recessing the top surface of the mask layer 150 filling each of the first contact holes 135 and a portion of the top surface of the first insulating layer 121 adjacent to the first contact holes 135. Like the opening 155a, the horizontally extending hole 136 may expose a top surface 150a of the mask layer 150 disposed in the first contact hole 135 and a portion of the first insulating layer 121. The horizontally extending hole 136 provides the recessed hole 121R of the first insulating layer 121 described previously with reference to FIG. 1B.

Referring to FIG. 2E, the mask layer 150 and the mask pattern 155 disposed in the first and second contact holes 135 and 145, respectively, may be removed after forming the horizontally extending holes 136.

Referring again to FIG. 1B, once the mask layer 150 and mask pattern 155 have been removed, the first contact holes 135 and the horizontally extending holes 136 may be filled with a conductive material to form the first contact plugs 130. The second contact holes 145 may also be filled with a conductive material to form the second contact plugs 140. Here, the first and second contact plugs 130 and 140, respectively, may be formed at the same time. For example, the conductive material may be deposited on the substrate 100 to fill the first contact holes 135, the horizontally extending holes 136, and the second contact holes 145 at the same time. The deposited conductive material may then be planarized to a level of the first insulating layer 121 to complete the formation of the first and second contact plugs 130 and 140, respectively. The conductive material of the first and second contact plugs 130 and 140, respectively, may, for example, include at least one of a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride), or a metal-semiconductor compound (e.g., a metal silicide).

Each of the first contact plugs 130 may include a vertically extending portion 131 formed in the first contact hole 135 and a horizontally extending portion 132 formed in the horizontally extending hole 136. The vertically extending portion 131 and the horizontally extending portion 132 may be formed at the same time to constitute an integral body structure. The first and second contact plugs 130 and 140, respectively, may be the same as described previously with reference to FIGS. 1A and 1B.

After forming the first and second contact plugs 130 and 140, respectively, first data storage elements DS1 and second data storage elements DS2 may be formed on the first contact plugs 130 and the second contact plugs 140, respectively. Forming the first and second data storage elements DS1 and DS2, respectively, may include forming a data storage layer on the first insulating layer 121, and then patterning the data storage layer. By patterning the data storage layer, the first data storage elements DS1 may be formed on respective ones of the first contact plugs 130 and the second data storage elements DS2 may be formed on respective ones of the second contact plugs 140. The first and second data storage elements DS1 and DS2, respectively, may be formed at the same time through the same process.

In the method for manufacturing the semiconductor memory device according to this embodiment, the vertically and horizontally extending portions 131 and 132, respectively, may be formed simultaneously to constitute a single integrated structure (or integral body) using a damascene process, for example. In other words, additional processes for forming a pad corresponding to the horizontally extending portion 132 may not be required, so that the semiconductor memory device manufacturing process may be simplified.

Second Embodiment

Figure 3A:
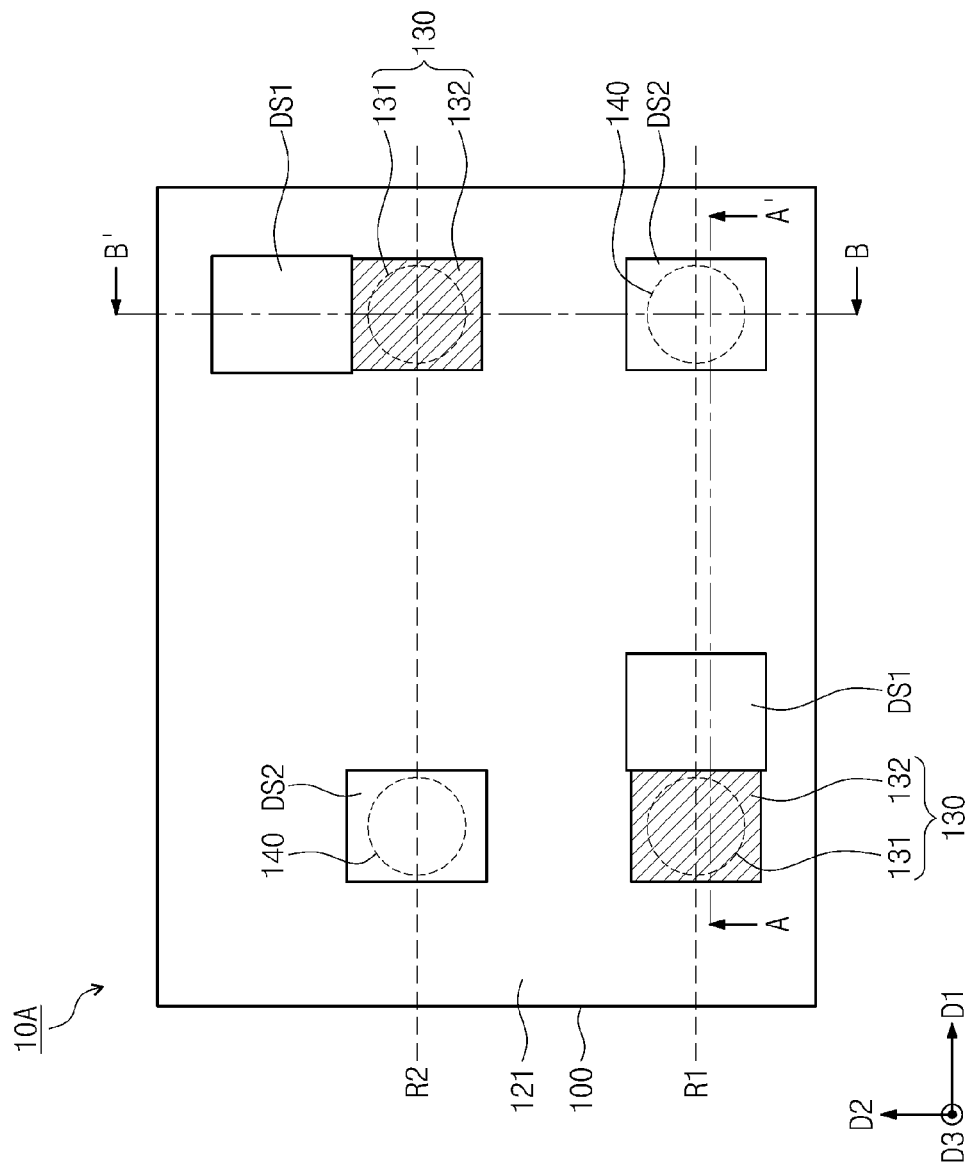
FIG. 3A is a plan view of a semiconductor memory device according to a further example embodiment of the inventive concepts.
Figure 3B:
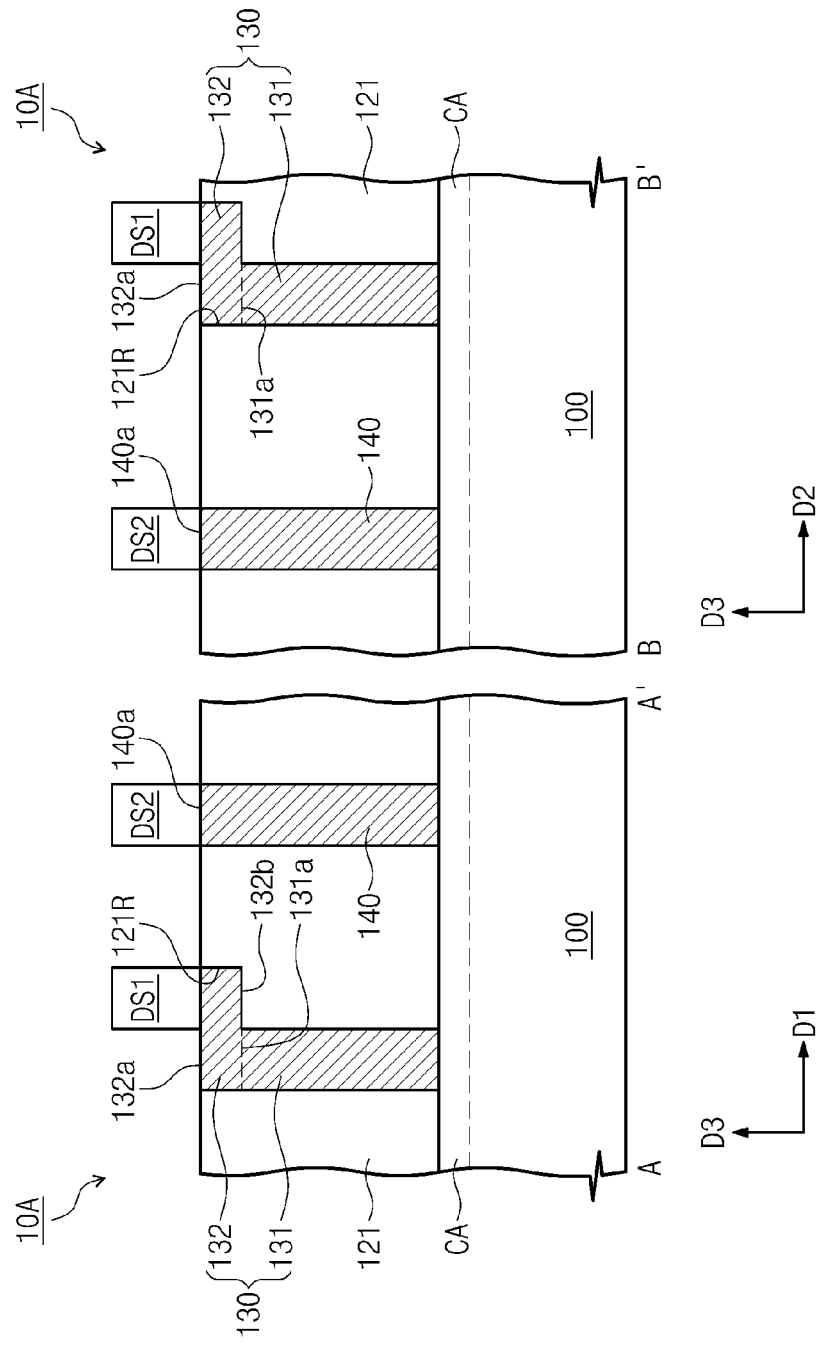
FIG. 3B provides cross-sectional views of the semiconductor memory device of FIG. 3A, taken along lines A-A' and B-B'.

FIG. 3A is a plan view of a semiconductor memory device 10A according to another example embodiment of the inventive concepts, and FIG. 3B provides cross-sectional views taken along lines A-A' and B-B' of FIG. 3A. For conciseness, in the description of the present embodiment, the same technical features previously described with reference to FIGS. 1A and 1B may be only briefly mentioned, or their description may be entirely omitted. In other words, the following description will focus on the differences between the present embodiment and the first embodiment shown in FIGS. 1A and 1B.

Referring to FIGS. 3A and 3B, each of first contact plugs 130 may include a vertically extending portion 131 extending vertically from a top surface of a cell active portion CA and a horizontally extending portion 132 disposed between the vertically extending portion 131 and a first data storage element DS1. The horizontally extending portion 132 may be disposed on the vertically extending portion 131 to extend in a first direction D1 that is parallel to a top surface of the substrate 100. Alternatively, the horizontally extending portion 132 may extend in a second direction D2 that intersects the first direction D1. However, the inventive concepts are not limited thereto, and the horizontally extending portion 132 may extend in any desired direction. The first data storage element DS1 may be spaced apart from the vertically extending portion 131 in the first direction D1 when viewed in plan view. Alternatively, the first data storage element DS1 may be spaced apart from the vertically extending portion 131 in the second direction D2 when viewed in plan view. Or the data storage element DS1 may be spaced apart from the vertically extending portion 131 in any other desired direction.

As illustrated in FIG. 3A, the first contact plugs 130 and the second contact plugs 140 may be two-dimensionally arranged in a first row R1 and a second row R2 that are each parallel to the first direction D1. The second row R2 may be spaced apart from the first row R1 in the second direction D2. The first and second contact plugs 130 and 140, respectively, of each of the first and second rows R1 and R2, respectively, may be alternately arranged in the first direction D1.

In the first row R1, the first of the contact plugs in the first direction D1 may be a first contact plug 130 and the second of the contact plugs in the first direction D1 may be a second contact plug 140. First and second contact plugs 130 and 140, respectively, may be alternately and repeatedly arranged in the first row R1.

In the second row R2, the first of the contact plugs in the first direction D1 may be a second contact plug 140 and the second of the contact plugs in the first direction D1 may be a first contact plug 130. Here, the first contact plug 130 of the second row R2 may include a horizontally extending portion 132 extending in the second direction D2. The second and first contact plugs 140 and 130, respectively, may be alternately and repeatedly arranged in the second row R2.

For example, the first contact plug 130 of the first row R1 may include a horizontally extending portion 132 extending in the first direction D1, and the first contact plug 130 of the second row R2 may include a horizontally extending portion 132 extending in the second direction D2. Alternatively, each of the first contact plugs 130 of the first and second rows R1 and R2, respectively, may include a horizontally extending portion 132 extending in the first direction D1 or a horizontally extending portion 132 extending in the second direction D2. In other words, the directions in which the horizontally extending portions 132 of the first contact plugs 130 of the first and second rows R1 and R2, respectively, extend may be selected according to a desired arrangement of the first data storage elements DS1.

In the semiconductor memory device according to the present embodiment, the first contact plugs 130 may include a horizontally extending portion 132 extending in the second direction D2 as well as a horizontally extending portion 132 extending in the first direction D1. A degree of freedom with respect to the arrangement of the first and second data storage elements DS1 and DS2, respectively, may therefore be increased.

Third Embodiment

Figure 4A:
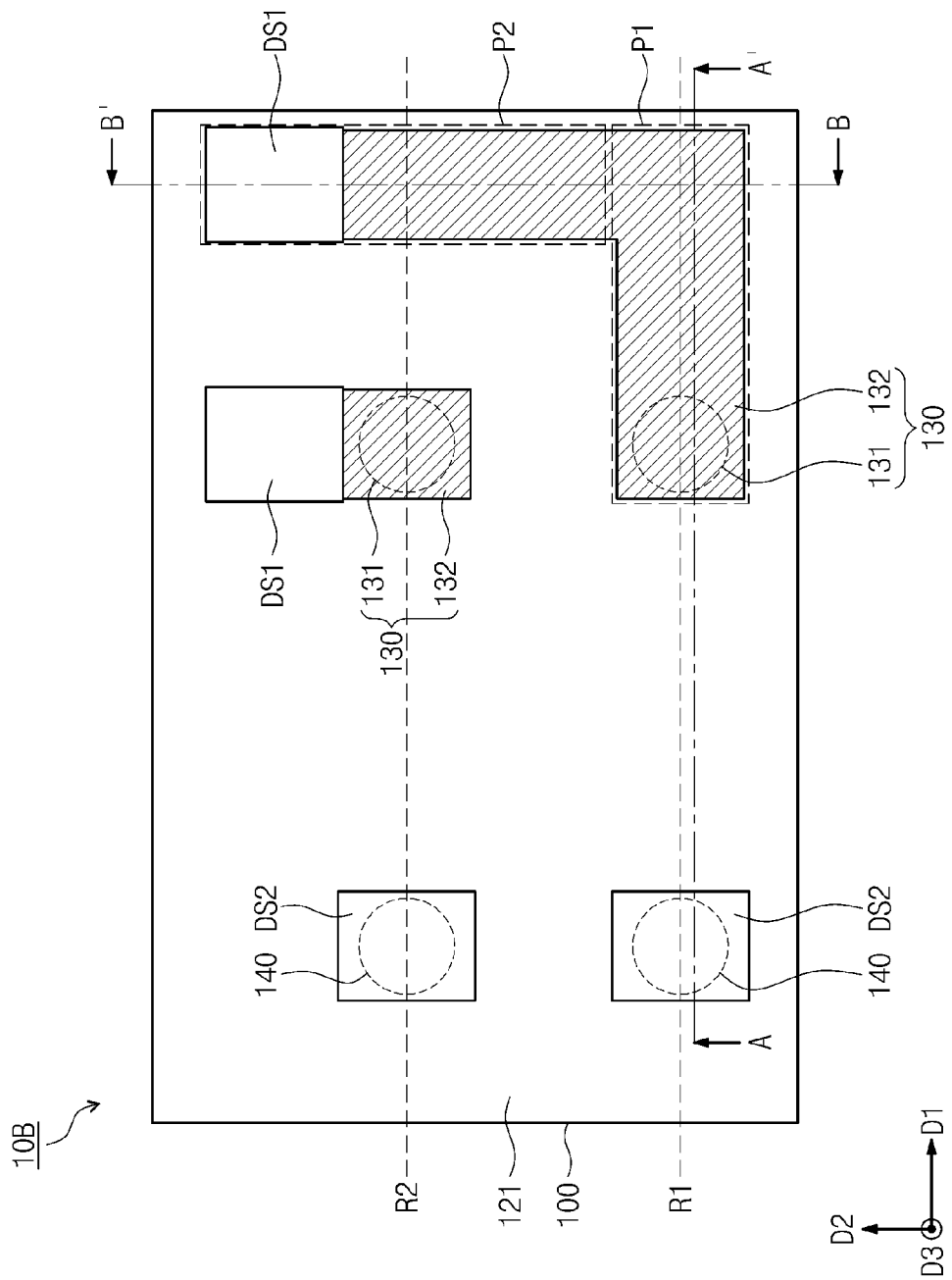
FIG. 4A is a plan view of a semiconductor memory device according to another example embodiment of the inventive concepts.
Figure 4B:
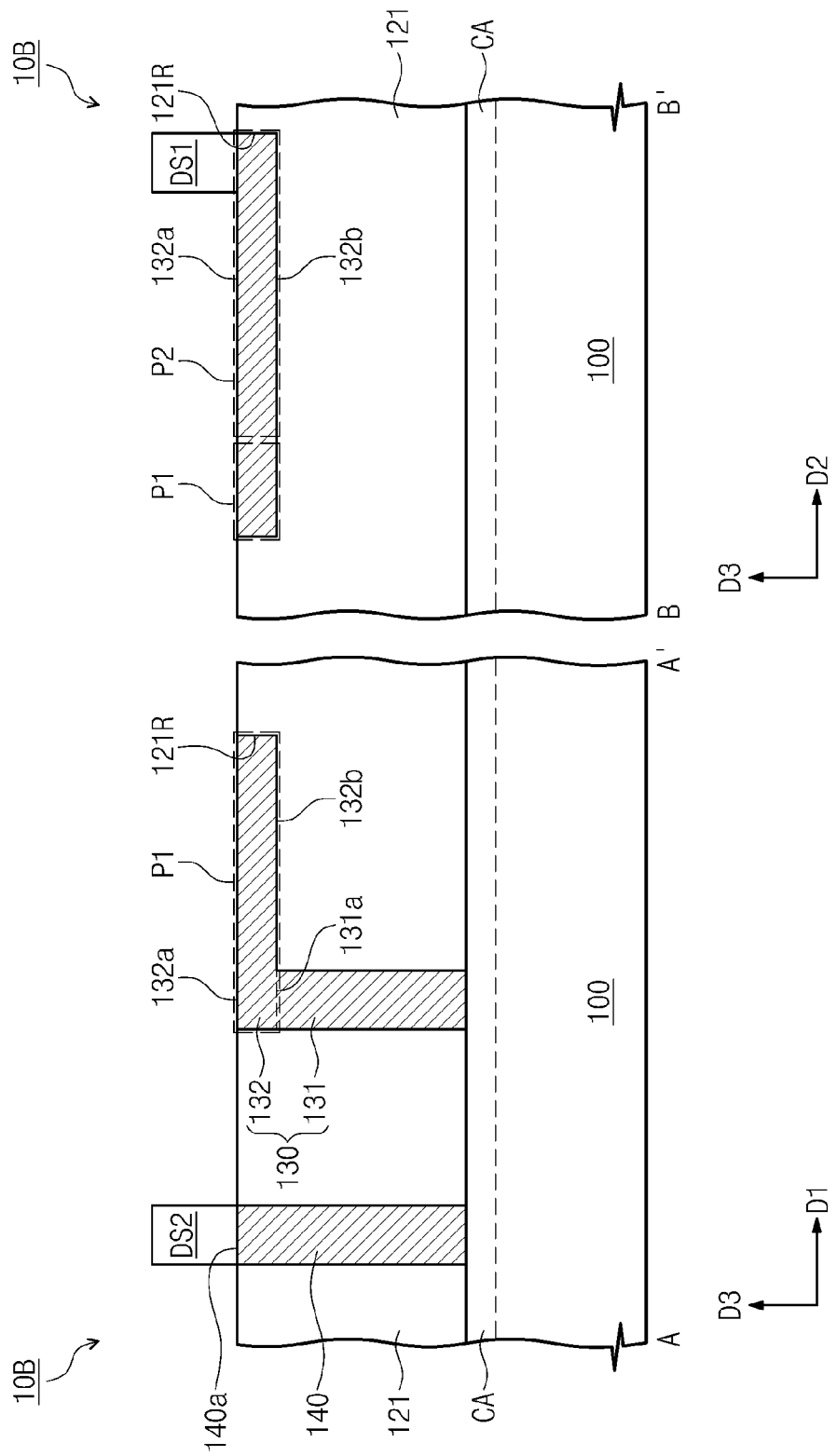
FIG. 4B provides cross-sectional views of the semiconductor memory device of FIG. 4A, taken along lines A-A' and B-B'.

FIG. 4A is a plan view illustrating a semiconductor memory device according 10B to another example embodiment of the inventive concepts. FIG. 4B provides cross-sectional views taken along lines A-A' and B-B' of FIG. 4A. With respect to this embodiment, descriptions of the same technical features as described previously may be omitted entirely or mentioned only briefly. In other words, the following description will focus on differences between the present embodiment and the first embodiment of FIGS. 1A and 1B.

Referring to FIGS. 4A and 4B, each of first contact plugs 130 may include a vertically extending portion 131 extending vertically from a top surface of a cell active portion CA and a horizontally extending portion 132 disposed between the vertically extending portion 131 and a first data storage element DS1. The horizontally extending portion 132 may be disposed on the vertically extending portion 131 to extend in a first direction D1 that is parallel to a top surface of the substrate 100. Alternatively, the horizontally extending portion 132 may extend in a second direction D2 that intersects the first direction D1.

In still other embodiments, the horizontally extending portion 132 may include a first portion P1 extending from the top surface 131a of the vertically extending portion 131 in the first direction D1 and a second portion P2 extending from the first portion P1 in the second direction D2. Here, the first data storage element DS1 may be disposed on the second portion P2. The first data storage element DS1 may be spaced apart from the vertically extending portion 131 in the second direction D2 when viewed in plan view. Alternatively, the first data storage element DS1 may be spaced apart from the vertically extending portion 131 in both the first direction D1 and the second direction D2 when viewed in plan view.

As illustrated in FIG. 4A, the first contact plugs 130 and the second contact plugs 140 may be two-dimensionally arranged in a first row R1 and a second row R2. The second row R2 may be spaced apart from the first row R1 in the second direction D2. The first and second contact plugs 130 and 140, respectively, may be alternately and repeatedly arranged in each of the first and second rows R1 and R2, respectively.

In the first row R1, the first of the contact plugs in the first direction D1 may be a second contact plug 140 and the second of the contact plugs in the first direction D1 may be a first contact plug 130, which includes the first portion P1 and the second portion P2.

In the second row R2, the first of the contact plugs in the first direction D1 may be a second contact plug 140 and the second of the contact plugs in the first direction D1 may be a first contact plug 130, which includes the horizontally extending portion 132 extending in the second direction D2. Thus, as shown in FIG. 4A, the first data storage element DS1 connected to the first contact plug 130 of the first row R1 may be arranged in line with the first data storage element DS1 connected to the first contact plug 130 of the second row R2 in the first direction D1. In other words, first data storage elements DS1, which are connected to the first contact plugs 130 disposed in different rows, may be arranged in a row through use of horizontally extending portions 132 that include both the first portion P1 and the second portion P2. Various shapes of horizontally extending portions 132 of the first contact plugs 130 of the first and second rows R1 and R2, respectively, may be selected, as desired, to provide any desired arrangement of the first data storage elements DS1.

In the semiconductor memory device 10B according to this embodiment, since at least one of the first contact plugs 130 may include the first portion P1 and the second portion P2, a degree of freedom of arrangement of the first and second data storage elements DS1 and DS2, respectively, may be increased.

Fourth Embodiment

Figure 5A:
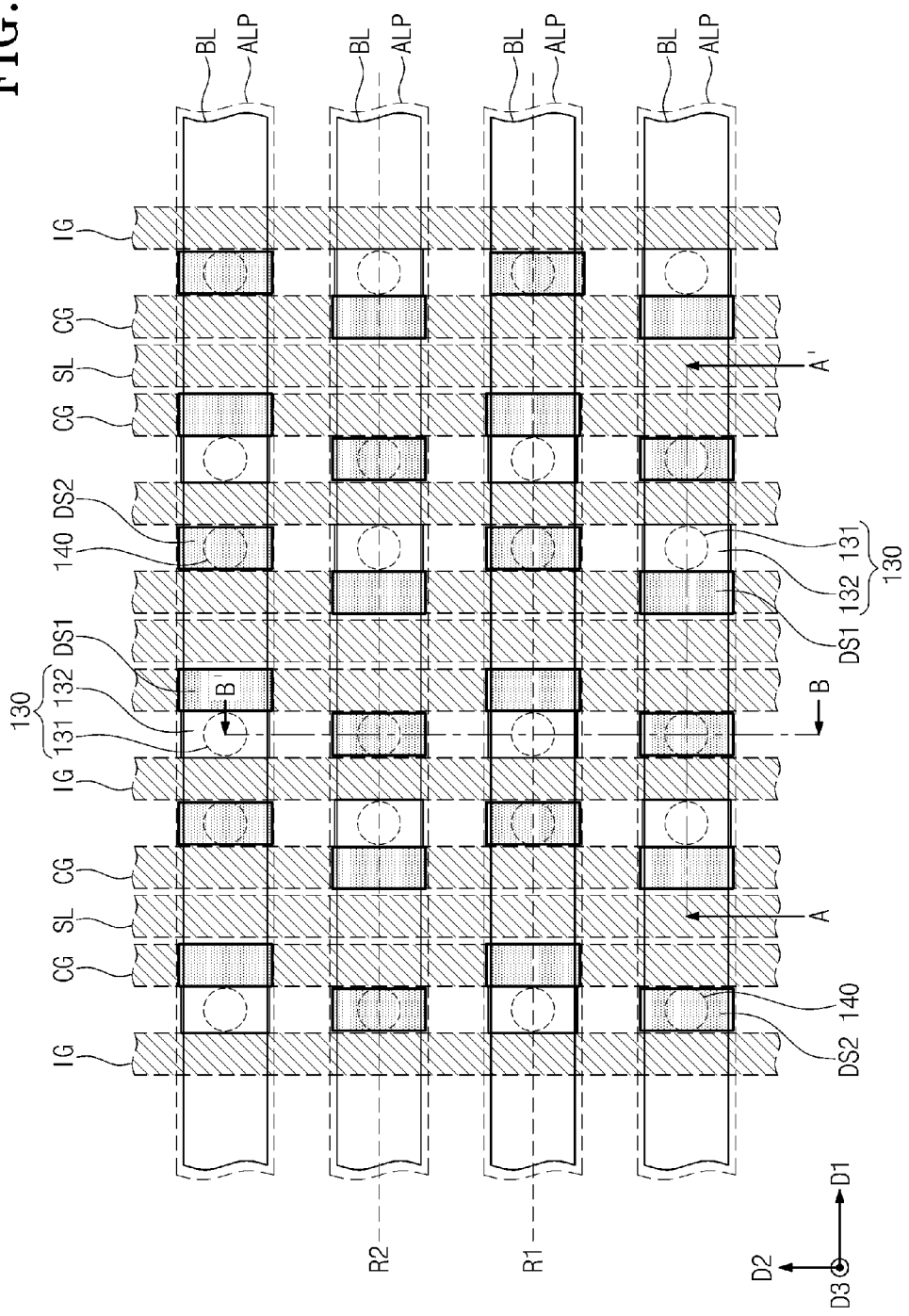
FIG. 5A is a plan view of a semiconductor memory device according to a still further example embodiment of the inventive concepts.
Figure 5B:
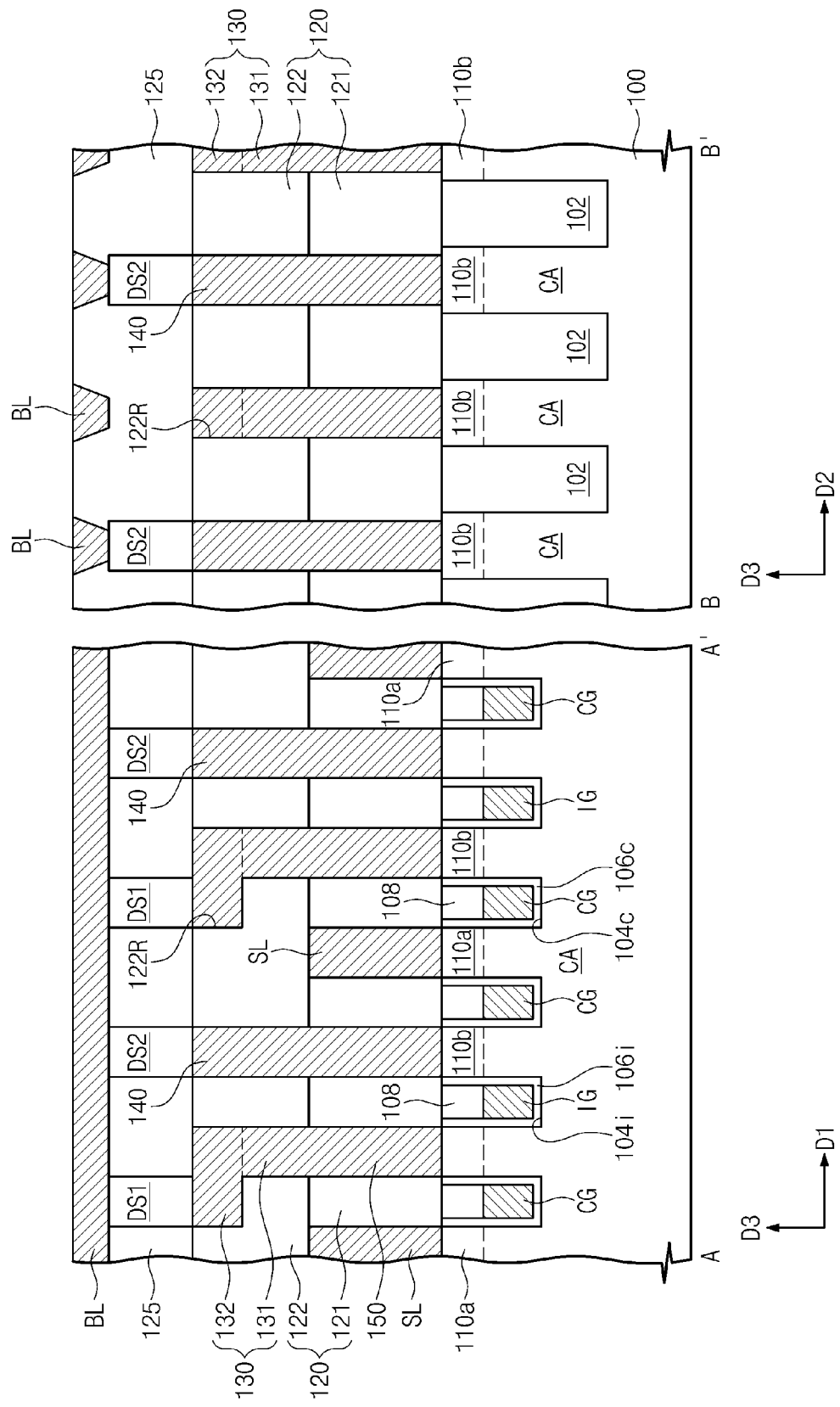
FIG. 5B provides cross-sectional views of the semiconductor memory device of FIG. 5A, taken along lines A-A' and B-B'.

FIG. 5A is a plan view illustrating a semiconductor memory device according to a still further example embodiment of the inventive concepts, and FIG. 5B provides cross-sectional views taken along lines A-A' and B-B' of FIG. 5A. Referring to FIGS. 5A and 5B, a cell region of a semiconductor memory device according to the present embodiment may include memory cells. Even though not illustrated in the drawings, the semiconductor memory device according to the present embodiment may further include a peripheral region including peripheral circuits.

As shown in FIGS. 5A and 5B, device isolation patterns 102 may be formed in a substrate 100. The device isolation patterns 102 disposed in the cell region may define active line patterns ALP. Each of the active line patterns ALP may be defined between a pair of adjacent device isolation patterns 102. As illustrated in FIG. 5A, the device isolation patterns 102 and the active line patterns ALP may each extend along a first direction D1 that is parallel to a top surface of the substrate 100. The device isolation patterns 102 and the active line patterns ALP may be alternately and repeatedly arranged in a second direction D2 that intersects the first direction D1. The active line patterns ALP may be doped with dopants of a first conductivity type. The substrate 100 may, for example, be a silicon substrate, a germanium substrate, or a silicon-germanium substrate.

Isolation recess regions 104i may intersect the active line patterns ALP and the device isolation patterns 102. The isolation recess regions 104i may have groove shapes (in cross-sectional view) extending in parallel to each other along the second direction D2 (in plan view). The isolation recess regions 104i may divide each of the active line patterns ALP into a plurality of cell active portions CA. Each of the cell active portions CA may correspond to a portion of the active line pattern ALP that is disposed between a pair of adjacent isolation recess regions 104i. In other words, each of the cell active portions CA may be defined by a pair of adjacent device isolation patterns 102 and a pair of adjacent isolation recess regions 104i. The cell active portions CA may be arranged along rows and columns in plan view. The cell active portions CA divided from each of the active line patterns ALP may be arranged in a row in the first direction D1, and the cell active portions CA disposed between the pair of adjacent isolation recess regions 104i may be arranged in a column in the second direction D2.

At least one gate recess region 104c may intersect the cell active portions CA. The gate recess region 104c may have a groove shape extending parallel to the isolation recess regions 104i. In some embodiments, a pair of gate recess regions 104c may intersect the cell active portions CA. In this case, a pair of cell transistors may be formed in each cell active portion CA.

A depth of the gate recess region 104c may be substantially equal to a depth of the isolation recess region 104i. A width of the gate recess region 104c may be equal to, or different from, a width of the isolation recess region 104i. The depths of the gate and isolation recess regions 104c and 104i, respectively, may be smaller than a depth of a bottom surface of the device isolation pattern 102.

A cell gate electrode CG may be disposed in each of the gate recess regions 104c, and a cell gate dielectric layer 106c may be disposed between the cell gate electrode CG and an inner surface of the gate recess region 104c. Due to the shape of the gate recess region 104c, the cell gate electrode CG may have a substantially linear shape extending in the second direction D2. The cell transistor including the cell gate electrode CG may include a recessed channel region due to the gate recess region 104c.

An isolation gate electrode IG may be disposed in each of the isolation recess regions 104i, and an isolation gate dielectric layer 106i may be disposed between the isolation gate electrode IG and an inner surface of the isolation recess region 104i. The isolation gate electrode IG may also have a substantially linear shape extending in the second direction D2.

Gate hard mask patterns 108 may be disposed on the cell and isolation gate electrodes CG and IG, respectively. Top surfaces of the cell and isolation gate electrodes CG and IG, respectively, may be lower than top ends of the gate and isolation recess regions 104c and 104i, respectively. The gate hard mask patterns 108 may be disposed in the gate and isolation recess regions 104c and 104i, respectively. Top surfaces of the gate hard mask patterns 108 may be substantially coplanar with the top surface of the substrate 100.

When the semiconductor memory device is operated, an isolation voltage may be applied to the isolation gate electrodes IG. The isolation voltage may prevent channels from being generated under the inner surfaces of the isolation recess regions 104i. In other words, isolation channel regions defined under the isolation gate electrodes IG may be turned-off by the isolation voltage. Thus, the cell active portions CA divided from each active line pattern ALP may be electrically isolated from each other. If the active line pattern ALP is doped with P-type dopants, the isolation voltage may, for example, be a ground voltage or a negative voltage.

The cell gate electrode CG may include at least one of a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride), or a metal-semiconductor compound (e.g., a metal silicide). In some embodiments, the isolation gate electrode IG may be formed of the same material as the cell gate electrode CG. The cell and isolation gate dielectric layers 106c and 106i, respectively, may each include at least one of an oxide (e.g., silicon oxide), a nitride (e.g., silicon nitride), an oxynitride (silicon oxynitride), or a high-k dielectric material (e.g., an insulating metal oxide such as hafnium oxide or aluminum oxide). The gate hard mask patterns 108 may include at least one of an oxide (e.g., silicon oxide), a nitride (e.g., silicon nitride), or an oxynitride (silicon oxynitride).

A first doped region 110a may be disposed in each cell active portion CA at a side of each cell gate electrode CG, and a second doped region 110b may be disposed in each cell active portion CA at an opposite side of each cell gate electrode CG. In some embodiments, the first doped region 110a may be disposed in each cell active portion CA between the pair of cell gate electrodes CG, and a pair of second doped regions 110b may be respectively disposed in both edge regions of each cell active portion CA with the pair of cell gate electrodes CG interposed therebetween. Thus, the pair of cell transistors formed in each cell active portion CA may share the first doped region 110a. The first and second doped regions 110a and 110b, respectively, may correspond to source/drain regions of the cell transistor. The first and second doped regions 110a and 110b, respectively, may be doped with dopants of which a second conductivity type is different from the first conductivity type of the cell active portion CA. A dopant of the first conductivity type may be an N-type dopant, and a dopant of the second conductivity type may be a P-type dopant, or vice versa.

Still referring to FIGS. 5A and 5B, an insulating layer 120 may be disposed on an entire top surface of the substrate 100. The insulating layer 120 may include a first insulating layer 121 and a second insulating layer 122 that are sequentially stacked. Source lines SL may respectively fill source-grooves formed in the first insulating layer 121. The source lines SL may extend parallel to each other along the second direction D2. Each of the source lines SL may be electrically connected to the first doped regions 110a that are arranged along the second direction D2. Top surfaces of the source lines SL may be substantially coplanar with a top surface of the first insulating layer 121. The source lines SL may include at least one of a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride), or a metal-semiconductor compound (e.g., a metal silicide).

In some embodiments, a capping interlayer insulating layer (not shown) may be disposed on an entire top surface of the first insulating layer 121. The capping interlayer insulating layer (not shown) may cover the top surfaces of the source lines SL. If the source lines SL include a metal, the capping interlayer insulating layer (not shown) may be formed of an insulating material capable of preventing metal atoms included in the source lines SL from being diffused into the second insulating layer 122.

The second insulating layer 122 may be disposed in the first insulating layer 121. If the capping interlayer insulating layer (not shown) is provided, the second insulating layer 122 may be disposed on the capping interlayer insulating layer (not shown). The second insulating layer 122 may be formed of an oxide (e.g., silicon oxide).

First contact plugs 130 and second contact plugs 140 may penetrate the second insulating layer 122 and the first insulating layer 121. Each of the first and second contact plugs 130 and 140, respectively, may be electrically connected to a corresponding one of the second doped regions 110b. In some embodiments, ohmic patterns (not shown) may be disposed between the first contact plug 130 and the second doped region 110b, between the second contact plug 140 and the second doped region 110b, and between the source line SL and the first doped region 110a, respectively. The ohmic patterns (not shown) may include a metal-semiconductor compound (e.g., a metal silicide such as cobalt silicide or titanium silicide). First data storage elements DS1 and second data storage elements DS2 may be disposed on the second insulating layer 122. The first data storage elements DS1 may be connected to respective ones of the first contact plugs 130. The second data storage elements DS2 may be connected to respective ones of the second contact plugs 140. The data storage elements DS1 and DS2 may be electrically connected to the second doped regions 110b through respective contact plugs 130 and 140. As illustrated in FIG. 5A, the data storage elements DS1 and DS2 may be two-dimensionally arranged along rows and columns when viewed in plan view.

Each of the first contact plugs 130 may include a vertically extending portion 131 extending vertically from the top surface of the cell active portion CA and a horizontally extending portion 132 disposed between the vertically extending portion 131 and a first data storage element DS1. The horizontally extending portion 132 may be disposed on the vertically extending portion 131 to extend in the first direction D1, which is parallel to the top surface of the substrate 100. Alternatively, the horizontally extending portion 132 may extend in a direction opposite to the first direction D1. In some embodiments, one of the first contact plugs 130 and one of the second contact plugs 140 may be disposed on each cell active portion CA between a pair of the isolation gate electrodes IG. The source line SL may be disposed between the first contact plug 130 and the second contact plug 140 to extend in the second direction D2.

If the vertically extending portion 131 of the first contact plug 130 is spaced apart from the source line SL in the direction opposite to the first direction D1 on each cell active portion CA between the isolation gate electrodes IG, the horizontally extending portion 132 may extend in the first direction D1. Or, if the vertically extending portion 131 of the first contact plug 130 is spaced apart from the source line in the first direction D1, the horizontally extending portion 132 may extend in the direction opposite to the first direction D1.

The second insulating layer 122 may include a recessed region 122R that is disposed in an upper portion of the second insulating layer 122. A bottom surface of the recessed region 122R may be lower than a top surface of the second insulating layer 122 and higher than the top surface of the source line SL. The horizontally extending portion 132 may be provided in the recessed region 122R of the second insulating layer 122.

Each of the second contact plugs 140 may extend vertically from the top surface of the cell active portion CA. Unlike the first contact plug 130, the second contact plug 140 may extend in only the third direction D3 and may not include a horizontally extending portion 132. Other features of the first and second contact plugs 140 may be the same as described in the previous embodiments.

The first contact plugs 130 and the second contact plugs 140 may be two-dimensionally arranged when viewed in plan view. The first and second contact plugs 130 and 140, respectively, may be arranged in a first row R1 and a second row R2. The second row R2 may be spaced apart from the first row R1 in the second direction D2. The first contact plugs 130 and the second contact plugs 140 of each of the first and second rows R1 and R2, respectively, may be alternately and repeatedly arranged.

Odd-numbered contact plugs of the first row R1 may be first contact plugs 130, and even-numbered contact plugs of the first row R1 may be second contact plugs 140.

On the other hand, odd-numbered contact plugs of the second row R2 may be second contact plugs 140, and even-numbered contact plugs of the second row R2 may be first contact plugs 130. The first and second rows R1 and R2, respectively, may be alternately and repeatedly arranged in the second direction D2.

Each of the first contact plugs 130 of the first row R1 may, for example, include a horizontally extending portion 132 extending in the first direction D1. Each of the first contact plugs 130 of the second row R2 may include a horizontally extending portion 132 extending in a direction opposite the first direction D1. Thus, the data storage elements DS1 and DS2 may be arranged in a zigzag pattern along columns parallel to the second direction D2.

Although not illustrated, each of the first contact plugs 130 of the first and second rows R1 and R2, respectively, may alternatively include one of the horizontally extending portions 132 selected from the alternative embodiments shown in FIGS. 3A and 4A. A desired configuration of first data storage elements DS1 can thereby be obtained.

In some embodiments, a protection insulating layer (not shown) may be conformally formed on surfaces of the data storage elements DS1 and DS2 and the second insulating layer 122. The protection insulating layer (not shown) may at least protect sidewalls of the data storage elements DS1 and DS2. For example, the protection insulating layer (not shown) may include at least one of a nitride (e.g., silicon nitride) and an oxynitride (e.g., silicon oxynitride).

A mold layer 125 may be disposed on the second insulating layer 122. If the protection insulating layer (not shown) exists, the mold layer 125 may be disposed on the protection insulating layer (not shown). The mold layer 125 may fill a space between the data storage elements DS1 and DS2.

A bit line BL may be disposed on the mold layer 125. In some embodiments, the bit line BL may be in direct contact with top surfaces of the data storage elements DS1 and DS2.

The data storage elements DS1 and DS2 will now be described in greater detail with reference to FIGS. 6A and 6B.

Figure 6A:
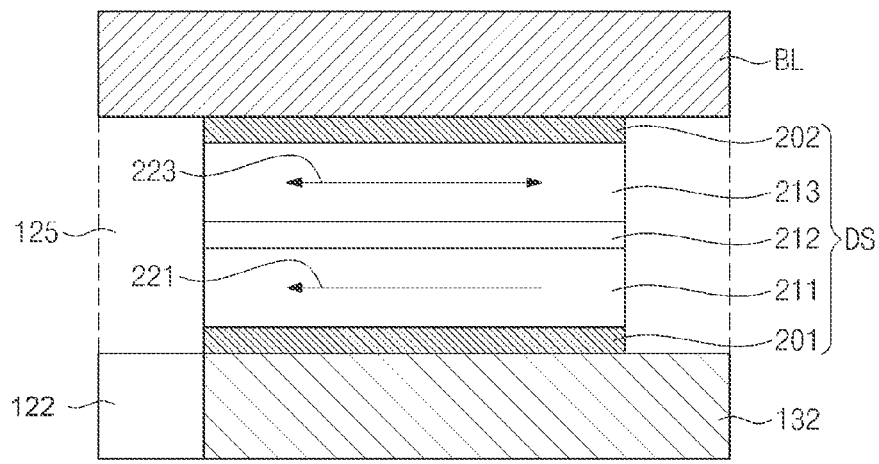
FIG. 6A is a cross-sectional view of a data storage element that may be included in a semiconductor memory device according to an example embodiment of the inventive concepts.

FIG. 6A is a cross-sectional view of a data storage element that may be included in a semiconductor memory device according to an example embodiment of the inventive concepts. FIG. 6B is a cross-sectional view of a data storage element according to another example embodiment.

Referring to FIG. 6A, a data storage element DS according to an embodiment of the inventive concepts may include a reference pattern 211, a free pattern 213, and a tunnel barrier pattern 212 disposed between the reference pattern 211 and the free pattern 213. The reference pattern 211 may have a magnetization direction 221 that is fixed in one direction. The free pattern 213 may have a magnetization direction 223 that is changeable to be parallel or anti-parallel to the magnetization direction 221 of the reference pattern 211. The magnetization directions 221 and 223 of the reference and free patterns 211 and 213, respectively, may be parallel to one surface of the tunnel barrier pattern 212 which is in contact with the free pattern 213. The reference pattern 211, the tunnel barrier pattern 212, and the free pattern 213 may constitute a magnetic tunnel junction (MTJ) pattern.

If the magnetization direction 223 of the free pattern 213 is parallel to the magnetization direction 221 of the reference pattern 211, the data storage element DS may have a first resistance value. If the magnetization direction 223 of the free pattern 213 is anti-parallel to the magnetization direction 221 of the reference pattern 211, the data storage element DS may have a second resistance value. Here, the first resistance value is smaller than the second resistance value. The data storage element DS may storage logical data using a difference between the first and second resistance values. The magnetization direction 223 of the free pattern 213 may be changed by spin torques of electrons included in a program current.

Each of the reference and free patterns 211 and 213, respectively, may include a ferromagnetic material. The reference pattern 211 may further include an anti-ferromagnetic material that pins a magnetization direction of the ferromagnetic material included in the reference pattern 211. The tunnel barrier pattern 212 may include at least one of magnesium oxide, titanium oxide, aluminum oxide, magnesium-zinc oxide, or magnesium-boron oxide.

The data storage element DS may further include a bottom electrode 201 and a top electrode 202. The reference pattern 211, the tunnel barrier pattern 212, and the free pattern 213 may be disposed between the bottom electrode 201 and the top electrode 202. As illustrated in FIG. 6A, the reference pattern 211, the tunnel barrier pattern 212, and the free pattern 213 may be sequentially stacked on the bottom electrode 201, and the top electrode 202 may be disposed on the free pattern 213. Alternatively, the free pattern 213, the tunnel barrier pattern 212, and the reference pattern 211 may be sequentially stacked on the bottom electrode 201, and the top electrode 202 may be disposed on the reference pattern 211. Each of the bottom and top electrodes 201 and 202, respectively, may include a conductive metal nitride such as titanium nitride, tantalum nitride, or tungsten nitride. The upper electrode 202 may be electrically connected to the bit line BL which is formed on the data storage element DS. The bit line BL may include a metal. For example, the bit line BL may include aluminum or copper. In the event the bit line BL includes copper, a temperature of a formation process of the bit line BL may be reduced. Thus, it may be possible to minimize or prevent deterioration of reliability of the data storage element DS. The bit line BL may further include a barrier metal and/or a glue metal.

Figure 6B:
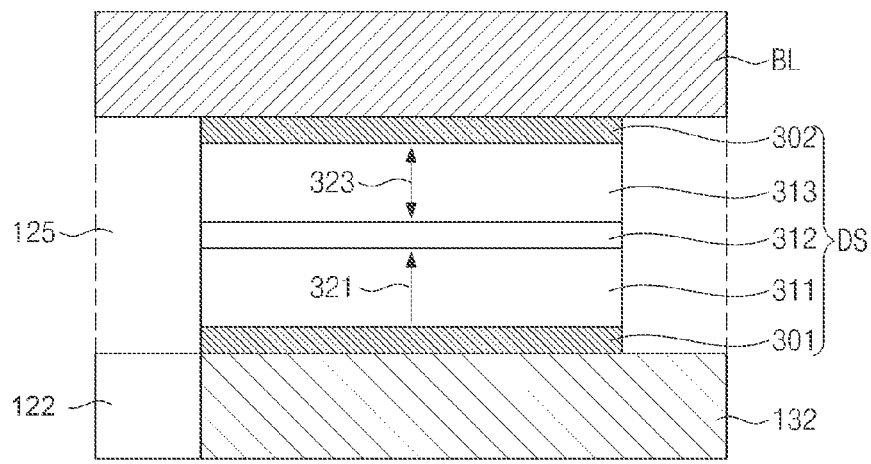
FIG. 6B is a cross-sectional view of a data storage element that may be included in a semiconductor memory device according to another example embodiment of the inventive concepts.

Referring to FIG. 6B, a data storage element DS according to another embodiment of the inventive concepts may include a perpendicular reference pattern 311, a perpendicular free pattern 313, and a tunnel barrier pattern 312 disposed between the perpendicular reference pattern 311 and the perpendicular free pattern 313. The perpendicular reference pattern 311 may have a magnetization direction 321 that is fixed in one direction. The perpendicular free pattern 313 may have a magnetization direction 323 that is changeable to be parallel or anti-parallel to the magnetization direction 321 of the perpendicular reference pattern 311. Here, the magnetization directions 321 and 323 of the reference and free patterns 311 and 313, respectively, may be substantially perpendicular to a surface of the tunnel barrier pattern 312 which is in contact with the free perpendicular pattern 313.

Each of the perpendicular reference and free patterns 311 and 313, respectively, may include at least one of a perpendicular magnetic material (e.g., CoFeTb, CoFeGd, or CoFeDy), a perpendicular magnetic material having a $L1_0$ structure, cobalt-platinum (CoPt) having a hexagonal close packed lattice structure, and a perpendicular magnetic structure. The perpendicular magnetic material having the $L1_0$ structure may include at least one of iron-platinum (FePt) having the $L1_0$ structure, iron-palladium (FePd) having the $L1_0$ structure, cobalt-palladium (CoPd) having the $L1_0$ structure, or cobalt-platinum (CoPt) having the $L1_0$ structure. The perpendicular magnetic structure may include magnetic layers and non-magnetic layers that are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where "n" denotes the number of stacked pairs of the layers. Here, the perpendicular reference pattern 311 may be thicker than the perpendicular free pattern 313 and/or the coercive force of the perpendicular reference pattern 311 may be greater than the coercive force of the perpendicular free pattern 313.

The tunnel barrier pattern 312 may include at least one of magnesium oxide, titanium oxide, aluminum oxide, magnesium-zinc oxide, or magnesium-boron oxide.

The data storage element DS may further include a bottom electrode 301 and a top electrode 302. As illustrated in FIG. 6B, the perpendicular reference pattern 311, the tunnel barrier pattern 312, and the perpendicular free pattern 313 may be sequentially stacked on the bottom electrode 301, and the top electrode 302 may be disposed on the perpendicular free pattern 313. Alternatively, the perpendicular free pattern 313, the tunnel barrier pattern 312, and the perpendicular reference pattern 311 may be sequentially stacked on the bottom electrode 301, and the top electrode 302 may be disposed on the perpendicular reference pattern 311. Each of the bottom and top electrodes 301 and 302, respectively, may be formed of a conductive metal nitride such as titanium nitride, tantalum nitride, or tungsten nitride. The upper electrode 302 may be electrically connected to the bit line BL which is formed on the data storage element DS. The bit line BL may include a metal. The bit line BL may be the same as described previously with reference to FIG. 5C or 6A.

Each of the first and second data storage elements DS1 and DS2, respectively, described previously with respect to the first through fourth embodiments, may, for example, be a data storage element DS as shown in FIG. 6A or a data storage element DS as shown in FIG. 6B.

FIGS. 7A through 7G include cross-sectional views of a semiconductor device during various stages of manufacture, and illustrate a method for manufacturing a semiconductor memory device according to an example embodiment of the inventive concepts. The cross-sectional views provided in FIGS. 7A through 7G are taken along the lines A-A' and B-B' of FIG. 5A.

Figure 7A:
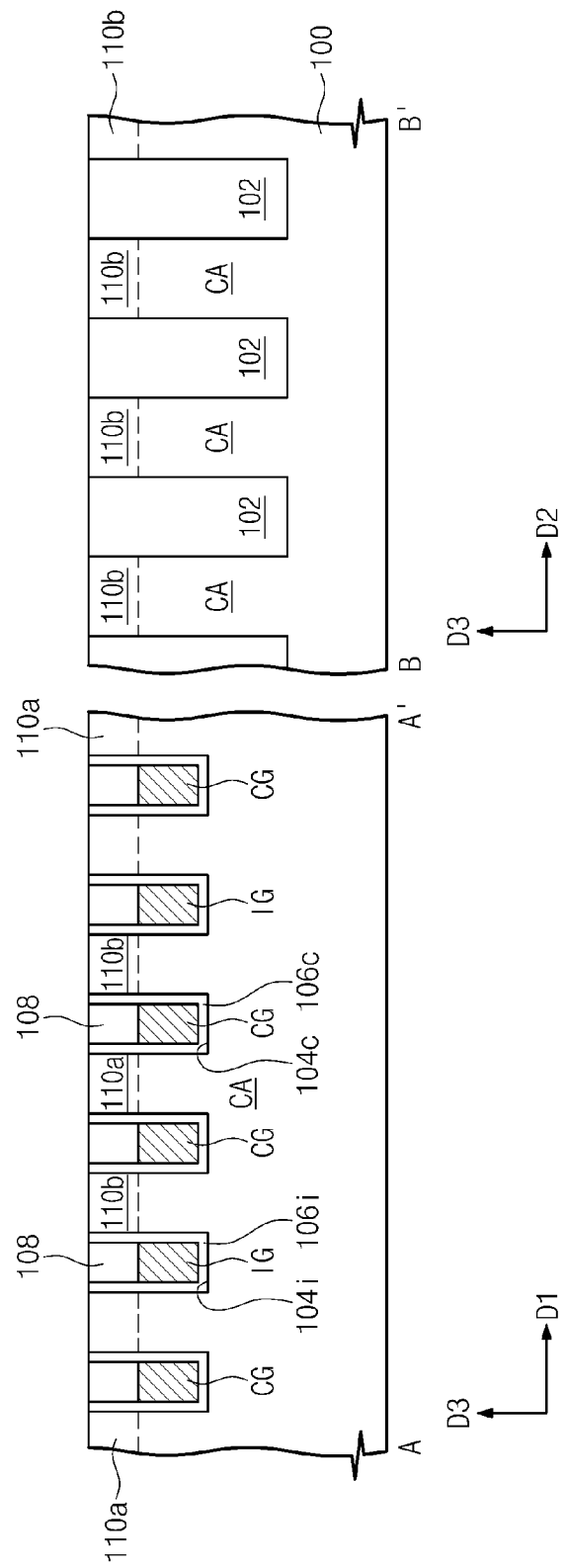
FIGS. 7A to 7G are cross-sectional views of a semiconductor memory device at different stages of manufacture, illustrating a method for manufacturing a semiconductor memory device according to a further example embodiment of the inventive concepts.

Referring to FIGS. 5A and 7A, a substrate 100 including a cell region may be prepared. Device isolation patterns 102 may be formed in the substrate 100 to define active line patterns ALP. The active line patterns ALP may extend in parallel to each other along the first direction D1 of FIG. 5A, which is parallel to a top surface of the substrate 100.

The active line patterns ALP and the device isolation patterns 102 may be patterned to form gate recess regions 104c and isolation recess regions 104i that extend in parallel along a second direction D2, which intersects the first direction D1. The isolation recess regions 104i may divide each of the active line patterns ALP into a plurality of cell active portions CA. The gate recess regions 104c may intersect the cell active portions CA. Depths of the gate and isolation recess regions 104c and 104i, respectively, may be smaller than a depth of a bottom surface of the device isolation pattern 102.

A cell gate dielectric layer 106c having a substantially uniform thickness may be formed on an inner surface of each of the gate recess regions 104c. An isolation gate dielectric layer 106i having a substantially uniform thickness may be formed on an inner surface of each of the isolation recess regions 104i. In some embodiments, the cell and isolation gate dielectric layers 106c and 106i, respectively, may be formed at the same time. Each of the cell and isolation gate dielectric layers 106c and 106i, respectively, may include at least one of an oxide (e.g., silicon oxide), a nitride (e.g., silicon nitride), an oxynitride (e.g., silicon oxynitride), or a high-k dielectric material (e.g., an insulating metal oxide such as hafnium oxide or aluminum oxide).

Subsequently, a conductive layer may be formed to fill the recess regions 104c and 104i. The conductive layer may be etched to form cell gate electrodes CG and isolation gate electrodes IG in the gate recess regions 104c and the isolation recess regions 104i, respectively. Top surfaces of the cell gate electrodes CG and top surfaces of the isolation gate electrodes IG may be recessed to be lower than the top surface of the substrate 100.

A hard mask layer may be formed to fill the recess regions 104c and 104i on the cell and isolation gate electrodes CG and IG, respectively. The hard mask layer may be planarized to form gate hard mask patterns 108 in the recess regions 104c and 104i, respectively. The gate hard mask patterns 108 may include at least one of an oxide (e.g., silicon oxide), a nitride (e.g., silicon nitride), or an oxynitride (e.g., silicon oxynitride).

Dopants may be injected into each cell active portion CA at both sides of each cell gate electrode CG to form first doped regions 110a and second doped regions 110b. Bottom surfaces of the first and second doped regions 110a and 110b, respectively, may be higher than a bottom end of the cell gate electrode CG.

Figure 7B:
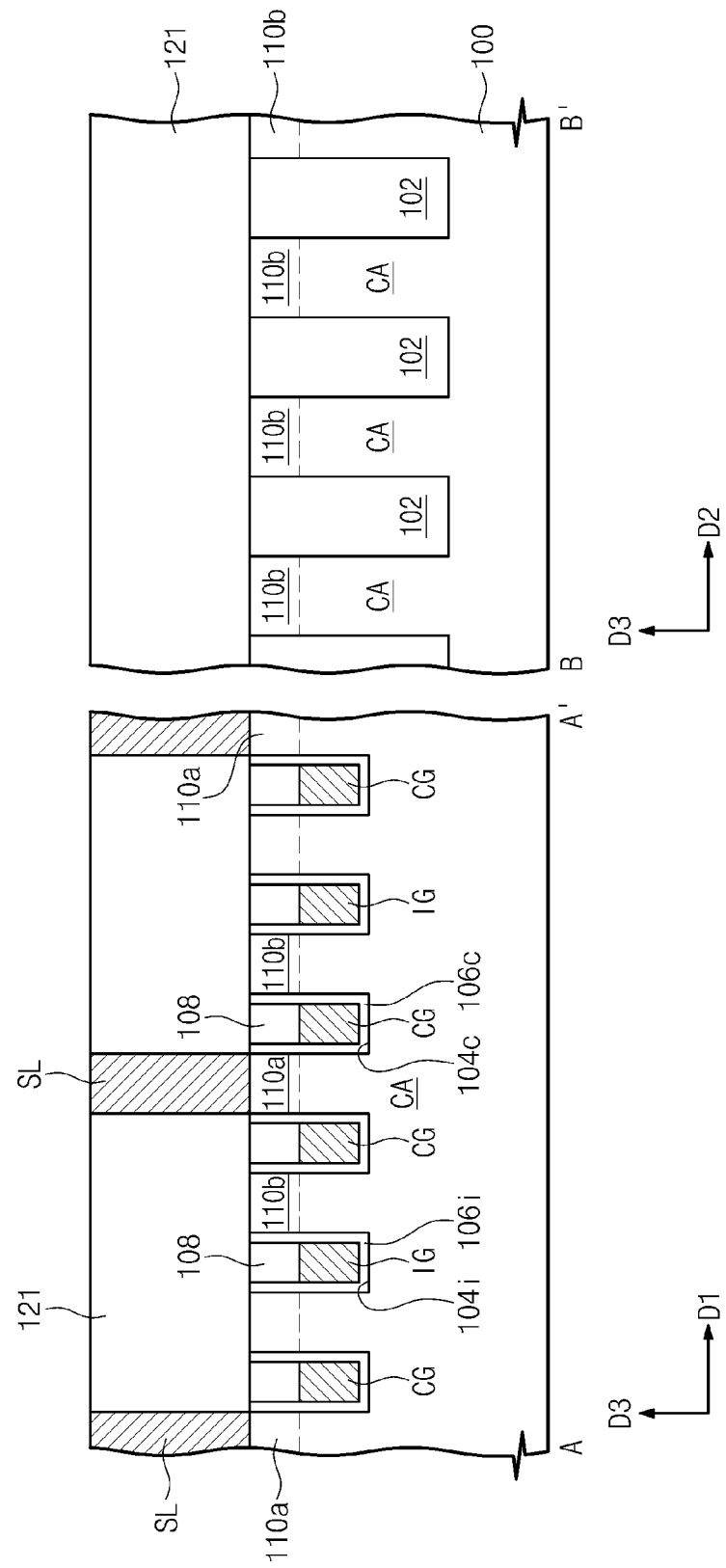

Referring to FIGS. 5A and 7B, a first insulating layer 121 may be formed on the substrate 100. The first insulating layer 121 may be formed of an oxide (e.g., silicon oxide). The first insulating layer 121 may be patterned to form source-grooves. A conductive layer may be formed to fill the source-grooves and may then be planarized until the first insulating layer 121 is exposed. Thus, source lines SL may be formed in the source-grooves. The source lines SL may be connected to the first doped regions 110a. The source lines SL may include at least one of a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride), or a metal-semiconductor compound (e.g., a metal silicide). In some embodiments, a capping interlayer insulating layer (not shown) may be formed on the first insulating layer 121 and the source lines SL.

Figure 7C:
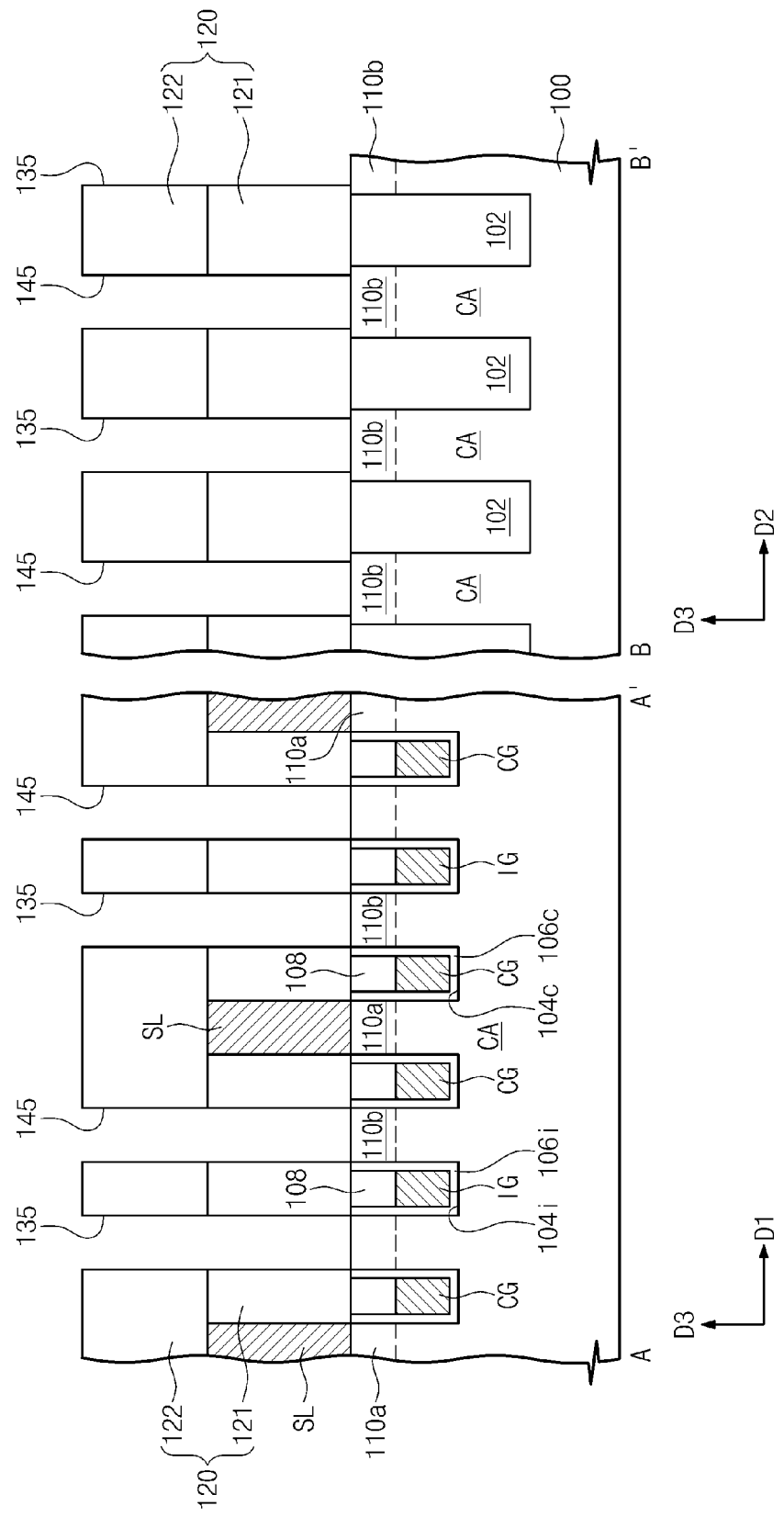

Referring to FIGS. 5A and 7C, a second insulating layer 122 may be formed on the first insulating layer 121. The second insulating layer 122 may be formed of an oxide (e.g., silicon oxide). The second insulating layer 122 and the first insulating layer 121 may be patterned to form first contact holes 135 and second contact holes 145 that expose the substrate 100. The first contact holes 135 and the second contact holes 145 may penetrate the second and first insulating layers 122 and 121, respectively. Each of the first and second contact plugs 135 and 145, respectively, may expose a corresponding one of the second doped regions 110b and may extend vertically from a top surface of the corresponding second doped region 110b.

The first contact holes 135 and the second contact holes 145 may be two-dimensionally arranged in a first row R1 and a second row R2 when viewed in plan view. The first and second contact holes 135 and 145, respectively, of each of the first and second rows R1 and R2, respectively, may be alternately and repeatedly arranged. The second row R2 may be spaced apart from the first row R1 in the second direction D2. Odd-numbered contact holes of the first row R1 and even-number contact holes of the second row R2 may be first contact holes 135, and even-numbered contact holes of the first row R1 and odd-numbered contact holes of the second row R2 may be second contact holes 145.

Figure 7D:
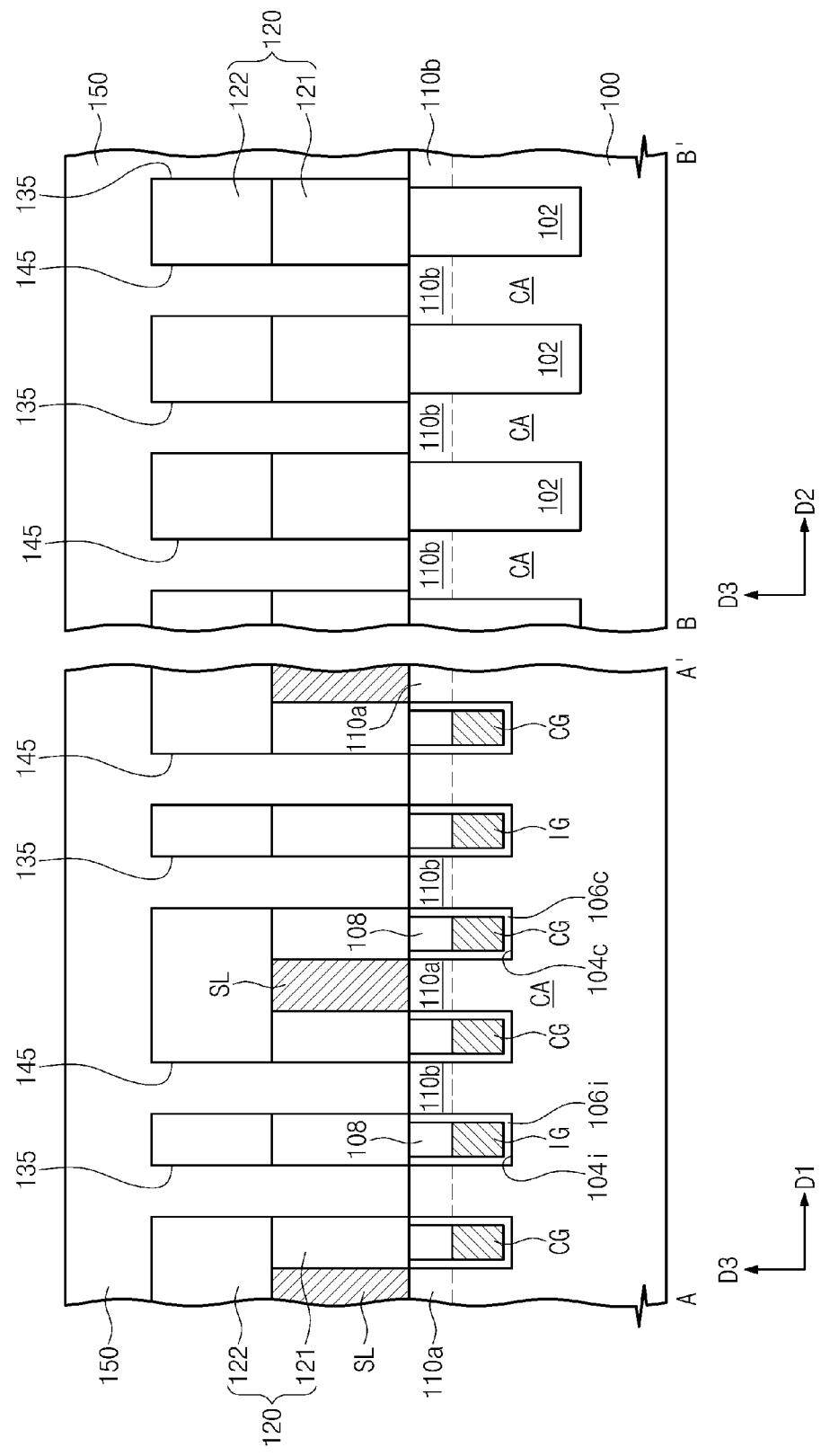

Referring to FIGS. 5A and 7D, a mask layer 150 may be formed on the second insulating layer 122. The mask layer 150 may cover a top surface of the second insulating layer 122 and may fill the first contact holes 135 and the second contact holes 145. The mask layer 150 may be formed of a material having an etch selectivity with respect to the second insulating layer 122. For example, the mask layer 150 may include at least one of a nitride (e.g., silicon nitride) and an oxynitride (e.g., silicon oxynitride).

Figure 7E:
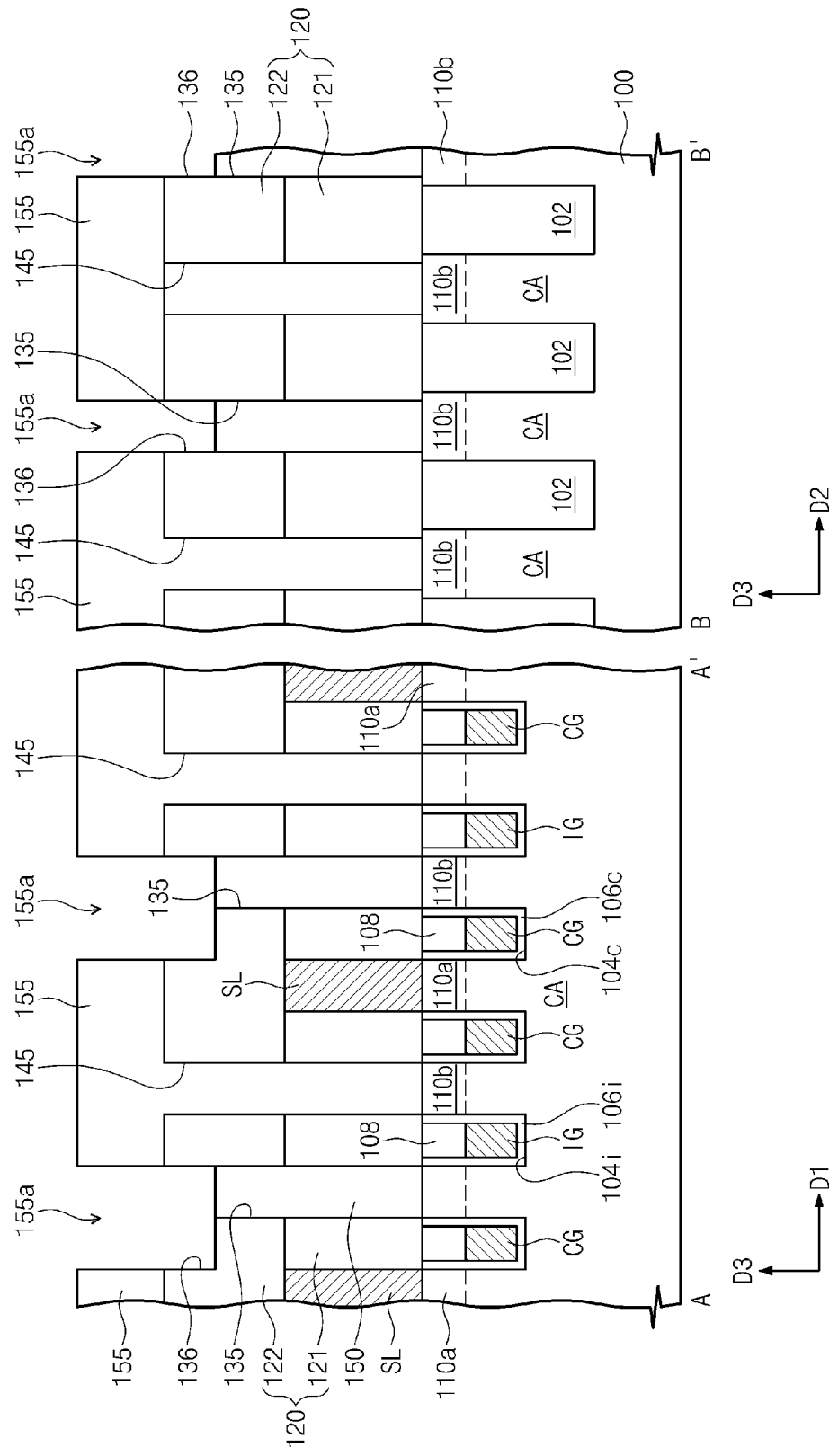

Referring to FIGS. 5A and 7E, the mask layer 150 may be patterned to form a mask pattern 155 having openings 155a. Each of the openings 155a may overlap with a corresponding one of the first contact holes 135. In addition, each of the openings 155a may expose a portion of the second insulating layer 122 that is adjacent to each of the first contact plugs 135. Regions exposed by the openings 155a may be etched to form horizontally extending holes 136 that extend from the first contact holes 135. More specifically, the portions of the second insulating layer 122 that are exposed by the openings 155a may be etched to form the horizontally extending holes 136. The horizontally extending holes 136 may expose a top surface of the mask layer 150 filling the first contact holes 135 and a portion of the second insulating layer 122. Other features of the process of forming the mask pattern 155 and the horizontally extending holes 136 may be substantially the same as described previously with reference to FIGS. 2C and 2D.

Each of the horizontally extending holes 136 of the first row R1 may, for example, extend from a corresponding one of the first contact holes 135 in the first direction D1. Each of the horizontally extending holes 136 of the second row R2 may extend from a corresponding one of the first contact holes 135 in a direction opposite to the first direction D1. (See FIG. 5A)

Figure 7F:
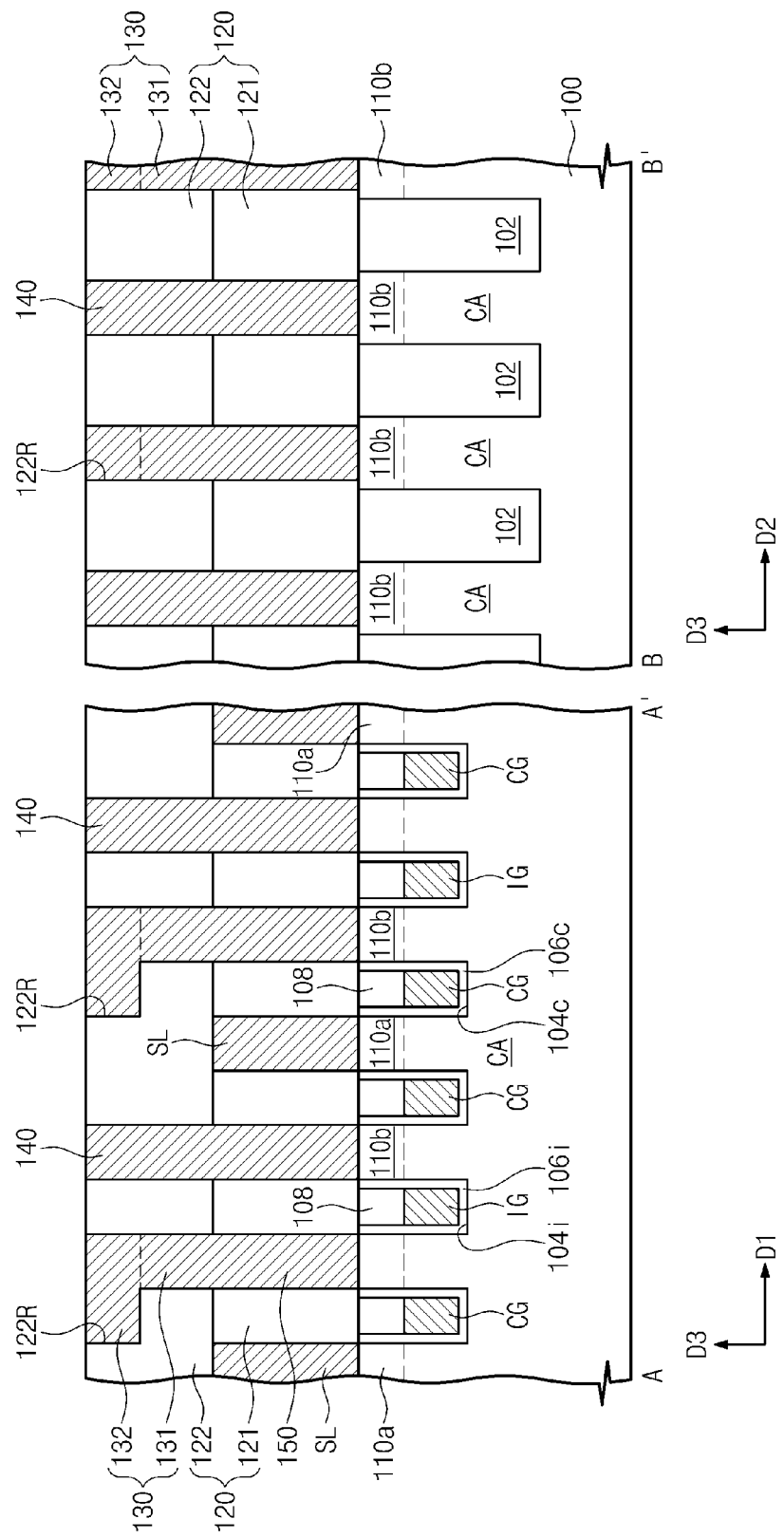

Referring to FIGS. 5A and 7F, the mask pattern 155 and the mask layer 150 filling the first and second contact holes 135 and 145, respectively, may be removed after the formation of the horizontally extending holes 136. Next, the first contact holes 135 and the horizontally extending holes 136 may be filled with a conductive material to form first contact plugs 130. The second contact holes 145 may be filled with a conductive material to form second contact plugs 140. The first contact plugs 130 and the second contact plugs 140 may be formed at the same time. In other words, the conductive material may be deposited to fill the first contact holes 135, the horizontally extending holes 136, and the second contact holes 145, and the deposited conductive material may then be planarized until the second insulating layer 122 is exposed, thereby completing the first and second contact plugs 130 and 140, respectively. The conductive material may include at least one of a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride), or a metal-semiconductor compound (e.g., a metal silicide).

Each of the first contact plugs 130 may include a vertically extending portion 131 filling the first contact hole 135 and a horizontally extending portion 132 filling the horizontally extending hole 136. The vertically extending portion 131 and the horizontally extending portion 132 may be formed simultaneously to constitute a single body. The first and second contact plugs 130 and 140, respectively, may be substantially the same as described previously with reference to FIGS. 5A and 5B.

Figure 7G:
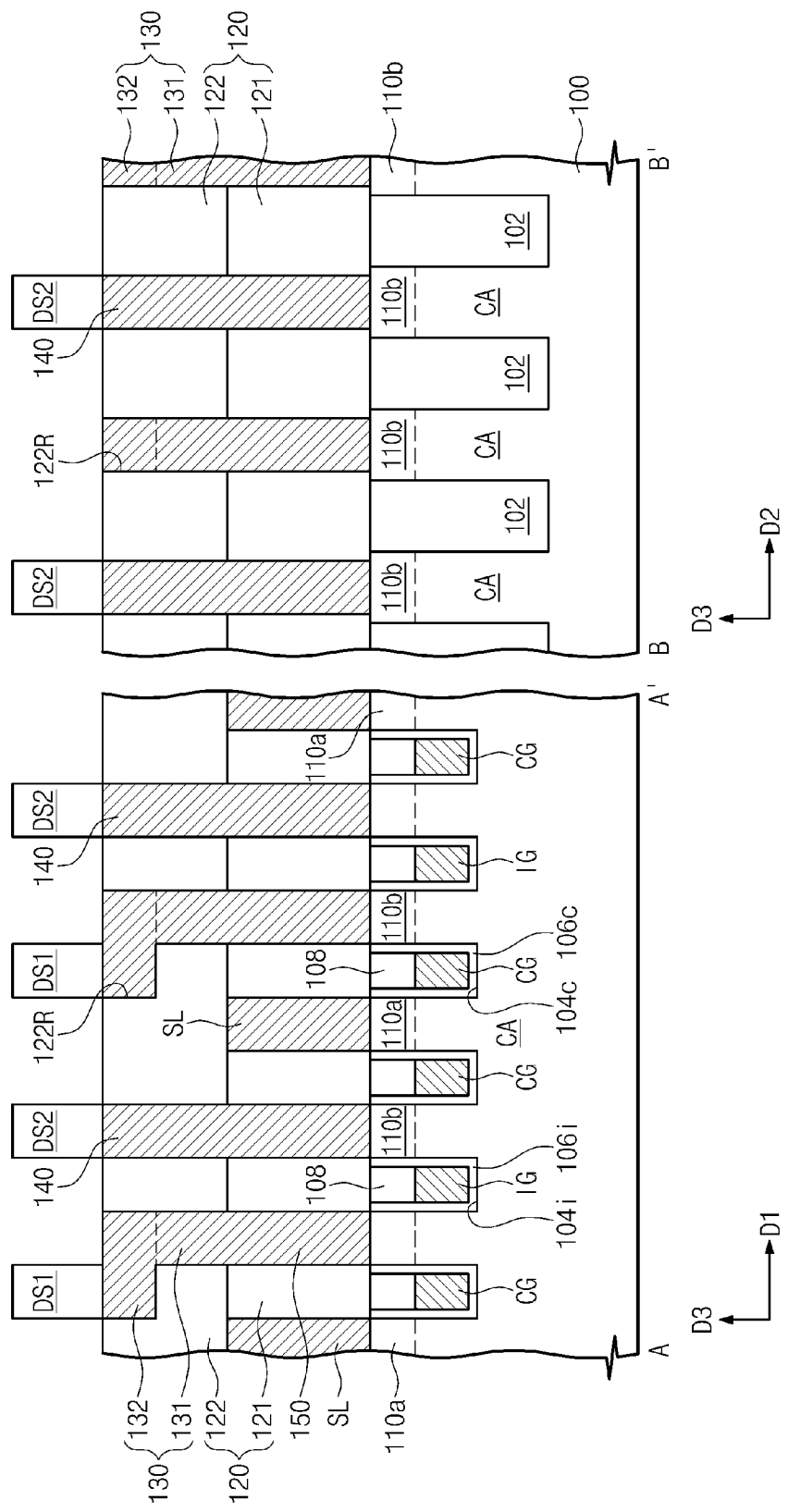

Referring to FIGS. 5A and 7G, first data storage elements DS1 and second data storage elements DS2 may be formed on the first contact plugs 130 and the second contact plugs 140, respectively. Forming the data storage elements DS1 and DS2 may include forming a data storage layer on an entire top surface of the substrate 100 and patterning the data storage layer. In some embodiments, the data storage layer may include a bottom electrode layer, a magnetic tunnel junction layer, and a top electrode layer which are sequentially stacked. As described above, the data storage layer may be patterned to form the first data storage elements DS1 and the second data storage elements DS2 on the first contact plugs 130 and the second contact plugs 140, respectively. The first and second data storage elements DS1 and DS2, respectively, may be formed at the same time.

Referring again to FIGS. 5A and 5B, a mold layer 125 may be formed on the second insulating layer 122. The mold layer 125 may fill a space between the data storage elements DS1 and DS2. Grooves extending in the first direction D1 may then be formed in the mold layer 125, and bit lines BL may be formed in the grooves. The grooves may expose top surfaces of the data storage elements DS1 and DS2. Thus, the bit lines BL may be in direct contact with top surfaces of the data storage elements DS1 and DS2.

Figure 8:
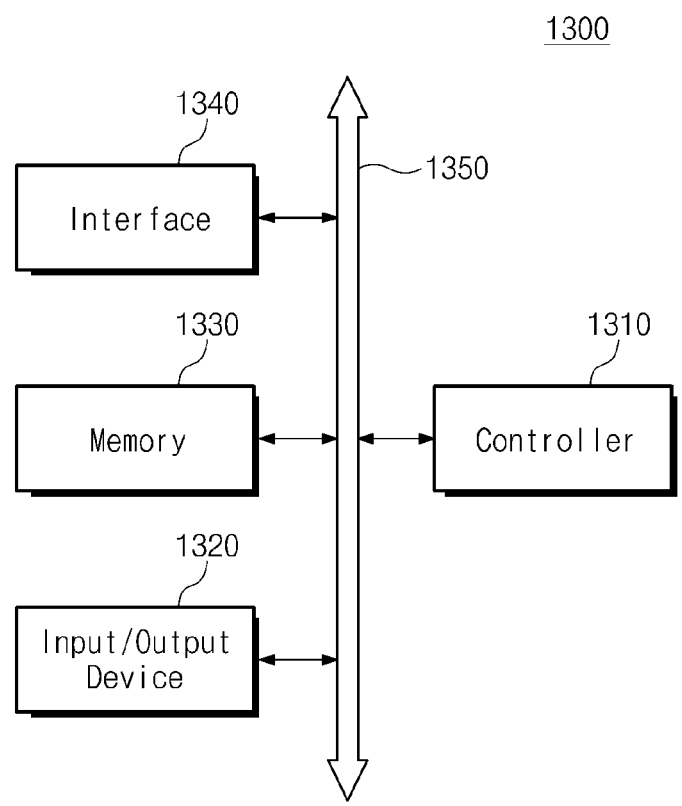
FIGS. 8 and 9 are schematic block diagrams illustrating electronic devices that may include semiconductor memory devices according to example embodiments of the inventive concepts.
Figure 9:
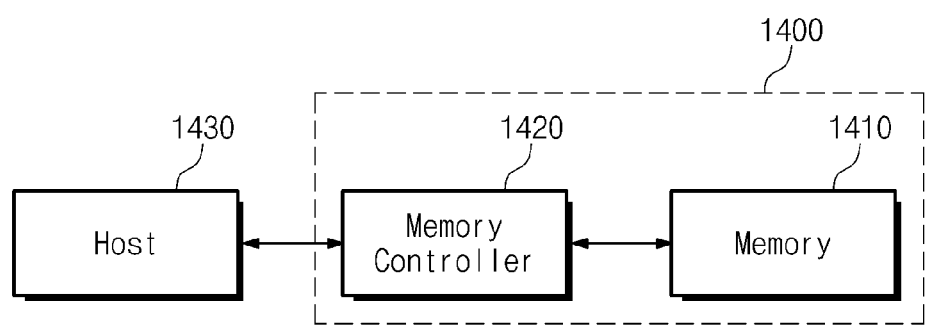

FIGS. 8 and 9 are schematic block diagrams illustrating electronic devices including semiconductor memory devices according to example embodiments of the inventive concepts.

Referring to FIG. 8, an electronic device 1300 may include one or more of the semiconductor memory devices constructed according to the embodiments of the inventive concepts. The electronic device 1300 may be one of a personal digital assistant (PDA), a laptop computer, a portable computer, a web tablet, a wireless phone, a mobile phone, a digital music player, a cable/wireless electronic device, or any composite electronic device including at least two of the above-mentioned devices. The electronic device 1300 may include a controller 1310, an input/output (I/O) unit 1320 (e.g., a keypad, a keyboard, or a display), a memory device 1330, and a wireless interface unit 1340 which are coupled to each other through a data bus 1350. For example, the controller 1310 may include at least one of a microprocessor, a digital signal processor, a microcontroller, or another logic device having a similar function to any one thereof. The memory device 1330 may store, for example, commands to be executed by the controller 1310. In addition, the memory device 1330 may store user's data. The memory device 1330 may include at least one of the semiconductor memory devices in the aforementioned embodiments of the inventive concepts. The electronic device 1300 may transmit data to a wireless communication network using a radio frequency (RF) signal or receive data from the wireless network through the wireless interface unit 1340. For example, the wireless interface unit 1340 may include an antenna or a wireless transceiver. The electronic device 1300 may be used to realize a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, or MMDS.

Referring to FIG. 9, one or more of the semiconductor memory devices according to the embodiments of the inventive concepts may be used to realize a memory system 1400. A memory system 1400 may include a memory device 1410 and a memory controller 1420 that are used to store massive data. The memory controller 1420 may control the memory device 1410 to read/write data from/into the memory device 1410 in response to read/write request of a host 1430. The memory controller 1420 may make an address mapping table for mapping an address provided from the host 1430 (e.g., a mobile device or a computer system) into a physical address of the memory device 1410. The memory device 1410 may include at least one of the semiconductor memory devices according to the above-described embodiments of the inventive concepts.

The semiconductor memory devices described in the aforementioned embodiments may be encapsulated using various packaging techniques. The package in which the semiconductor memory device is mounted may further include at least one semiconductor device (e.g., a controller and/or a logic device) that controls the semiconductor memory device.

In summary, a semiconductor memory device constructed according to embodiments of the inventive concepts may include contact plugs having different shapes from each other that are alternately arranged. Thus, a process margin between patterns may be improved. In addition, it may be possible to prevent an electrical short that might otherwise be caused during the patterning process of the data storage elements. Moreover, an additional pad for the data storage element may be omitted in the semiconductor memory device, so the manufacturing processes of the semiconductor memory device may be simplified.

While the inventive concepts have been described with reference to certain example embodiments, it will be apparent to those skilled in the art that various changes and modifications may be made thereto without departing from the spirit and scope of the inventive concepts. Therefore, it should be understood that the above embodiments are not limiting, but are merely illustrative. Thus, the scope of the inventive concepts are to be determined by the broadest permissible interpretation of the following claims and their equivalents, and should not be restricted or limited by the foregoing description.

What is claimed is:
1. A semiconductor memory device, comprising:
a first insulating layer covering a substrate;
a first contact plug and a second contact plug, each penetrating the first insulating layer;
a first data storage element disposed on the first contact plug and electrically connected to a portion of the substrate through the first contact plug; and
a second data storage element disposed on and overlapping the second contact plug and electrically connected to a portion of the substrate through the second contact plug,
wherein the first contact plug comprises:
a vertically extending portion; and
a horizontally extending portion arranged between the vertically extending portion and the first data storage element,
wherein the second contact plug vertically extends from a top surface of the substrate,
wherein the first data storage element is laterally spaced apart from the vertically extending portion,
wherein the first data storage element is disposed on the horizontally extending portion,
wherein a plurality of first contact plugs is provided and a plurality of second contact plugs is provided,
wherein the plurality of first contact plugs and the plurality of second contact plug are alternately and repeatedly arranged,
wherein each odd-numbered one of the contact plugs is one of the first contact plugs, and
wherein each even-numbered one of the contact plugs is one of the second contact plugs.
2. The semiconductor memory device of claim 1, wherein the first insulating layer includes a recessed region that is disposed in an upper portion of the first insulating layer,
wherein a bottom surface of the recessed region is lower than a top surface of the first insulating layer, and
wherein the horizontally extending portion is provided in the recessed region.
3. The semiconductor memory device of claim 1, wherein the horizontally extending portion is disposed on a top surface of the vertically extending portion, and
wherein the horizontally extending portion extends from the top surface of the vertically extending portion in a first direction or in a second direction that intersects the first direction.
4. The semiconductor memory device of claim 1, wherein the horizontally extending portion is disposed on a top surface of the vertically extending portion, and
wherein the horizontally extending portion comprises:
a first portion extending from the top surface of the vertically extending portion in a first direction; and
a second portion extending from the first portion in a second direction that intersects the first direction.
5. The semiconductor memory device of claim 1, further comprising:
a cell gate dielectric layer and a cell gate electrode sequentially disposed in a gate recess region intersecting a cell active portion defined in the substrate;

a first doped region and a second doped region disposed in the cell active portion at opposite sides of the gate recess region;

a second insulating layer disposed on the first insulating layer; and a source line disposed in the first insulating layer and connected to the first doped region.

6. The semiconductor memory device of claim 5, wherein the first contact plug and the second contact plug are arranged in a first direction, wherein the source line is disposed between the first contact plug and the second contact plug and extends in a second direction that intersects the first direction, and wherein the horizontally extending portion extends in the first direction or in a direction opposite to the first direction.

7. The semiconductor memory device of claim 5, wherein the second insulating layer includes a recessed region that is disposed in an upper portion of the second insulating layer, wherein a bottom surface of the recessed region of the second insulating layer is lower than a top surface of the second insulating layer and higher than a top surface of the source line, and wherein the horizontally extending portion is provided in the recessed region of the second insulating layer.

8. The semiconductor memory device of claim 5, wherein the plurality of first contact plugs and the plurality of second contact plugs are two-dimensionally arranged in a first row and a second row that are each parallel to a first direction, wherein the second row is spaced apart from the first row in a second direction that intersects the first direction, wherein each even-numbered contact plug of the second row is one of the first contact plugs, and wherein each odd-numbered contact plug of the second row is one of the second contact plugs.

9. The semiconductor memory device of claim 8, wherein the horizontally extending portions of the first row extend in the first direction, and wherein the horizontally extending portions of the second row extend in a direction opposite to the first direction.

10. A semiconductor memory device, comprising:

a first insulating layer covering a substrate;

a plurality of first contact plugs penetrating the first insulating layer, each of the first contact plugs comprising a vertically extending portion extending substantially vertically from the substrate through the first insulating layer, and a horizontally extending portion extending substantially horizontally from a top surface of the vertically extending portion;

a plurality of second contact plugs penetrating the first insulating layer, each of the second contact plugs spaced apart from the first contact plug in a first direction, the plurality of first and second contact plugs being alternately and repeatedly arranged in a first row;

a first data storage element disposed on the horizontally extending portion of the first contact plug such that all or a portion of the first data storage element does not overlap the vertically extending portion of the first contact plug; and a second data storage element disposed on and overlapping the second contact plug.

11. The semiconductor memory device of claim 10, wherein the second contact plug extends substantially vertically from a top surface of the substrate.

12. The semiconductor memory device of claim 10, wherein the horizontally extending portion extends from the top surface of the vertically extending portion in a first direction or in a second direction that intersects the first direction in a plan view.

13. The semiconductor memory device of claim 10, further comprising a plurality of second and first contact plugs alternately and repeatedly arranged in a second row.

14. A semiconductor memory device, comprising:

an insulating layer covering a substrate;

a first contact plug and a second contact plug, the first and second contact plugs penetrating the insulating layer and sequentially arranged in a first row that is substantially parallel to a first direction, a third contact plug and a fourth contact plug, the third and fourth contact plugs penetrating the insulating layer and sequentially arranged in a second row that is substantially parallel to the first direction;

a plurality of first data storage elements, a respective first data storage element being disposed on the first contact plug and on the fourth contact plug; and a plurality of second data storage elements, a respective second data storage element being disposed on and overlapping the second contact plug and on and overlapping the third contact plug, wherein each of the first and fourth contact plugs comprise:

a vertically extending portion extending substantially vertically from the substrate through the insulating layer; and a horizontally extending portion arranged between the vertically extending portion and the first data storage element such that all or a portion of the first data storage element does not overlap the vertically extending portion.

15. The semiconductor memory device of claim 14, wherein the second row is spaced apart from the first row in a second direction that intersects the first direction.

16. The semiconductor memory device of claim 14, wherein the second and third contact plugs extend substantially vertically from a top surface of the substrate.

17. The semiconductor memory device of claim 14, wherein the insulating layer includes recessed regions that are disposed in an upper portion of the insulating layer, wherein bottom surfaces of the recessed regions are lower than a top surface of the insulating layer, and wherein the horizontally extending portions of the first and fourth contact plugs are provided in the recessed regions, respectively.

18. The semiconductor memory device of claim 14, wherein a plurality of first contact plugs and a plurality of second contact plugs are alternately and repeatedly arranged in the first row, and wherein a plurality of third contact plugs and a plurality of fourth contact plugs are alternately and repeatedly arranged in the second row.

* * * * *